United States Patent
Huang et al.

(10) Patent No.: US 11,615,987 B2
(45) Date of Patent: Mar. 28, 2023

(54) BACKSIDE VIA WITH A LOW-K SPACER

(71) Applicant: Taiwan Semiconductor Manufacturing Company, Ltd., Hsinchu (TW)

(72) Inventors: Po-Yu Huang, Hsinchu (TW); I-Wen Wu, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 74 days.

(21) Appl. No.: 17/213,889

(22) Filed: Mar. 26, 2021

(65) Prior Publication Data

US 2022/0310455 A1    Sep. 29, 2022

(51) Int. Cl.
  *H01L 21/8234* (2006.01)
  *H01L 29/06* (2006.01)
  *H01L 29/786* (2006.01)
  *H01L 29/423* (2006.01)

(52) U.S. Cl.
  CPC .. *H01L 21/823475* (2013.01); *H01L 29/0665* (2013.01); *H01L 29/42392* (2013.01); *H01L 29/78696* (2013.01)

(58) Field of Classification Search
  CPC ....... H01L 29/42392; H01L 2029/7858; H01L 29/78696; H01L 29/0673; H01L 21/823475; H01L 29/0649; H01L 29/66553
  See application file for complete search history.

(56) References Cited

U.S. PATENT DOCUMENTS

| | | | |
|---|---|---|---|
| 8,963,258 B2 | 2/2015 | Yu et al. |
| 9,818,872 B2 | 11/2017 | Ching et al. |
| 9,887,269 B2 | 2/2018 | Ching et al. |
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |

(Continued)

*Primary Examiner* — Changhyun Yi
(74) *Attorney, Agent, or Firm* — Haynes and Boone, LLP

(57) ABSTRACT

A semiconductor structure and a method of forming the same are provided. In an embodiment, an exemplary method includes forming a fin-shaped structure extending from a front side of a substrate, recessing a source region of the fin-shaped structure to form a source opening, forming a semiconductor plug under the source opening, exposing the semiconductor plug from a back side of the substrate, selectively removing a first portion of the substrate without removing a second portion of the substrate adjacent to the semiconductor plug, forming a backside dielectric layer over a bottom surface of the workpiece, replacing the semiconductor plug with a backside contact, and selectively removing the second portion of the substrate to form a gap between the backside dielectric layer and the backside contact. By forming the gap, a parasitic capacitance between the backside contact and an adjacent gate structure may be advantageously reduced.

20 Claims, 23 Drawing Sheets

(56) References Cited

U.S. PATENT DOCUMENTS

| | | |
|---|---|---|
| 10,475,902 B2 | 11/2019 | Lee et al. |
| 2015/0380509 A1 | 12/2015 | Tsai et al. |
| 2018/0175036 A1 | 6/2018 | Ching et al. |
| 2022/0139911 A1* | 5/2022 | Wei .................... H01L 29/6681 257/365 |

* cited by examiner

BACKSIDE VIA WITH A LOW-K SPACER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, routing features may be moved to a backside of the substrate. Such routing features may include backside power rails or backside contacts. Capacitance between the backside contacts and adjacent gate structures may impact device performance. Therefore, while existing backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
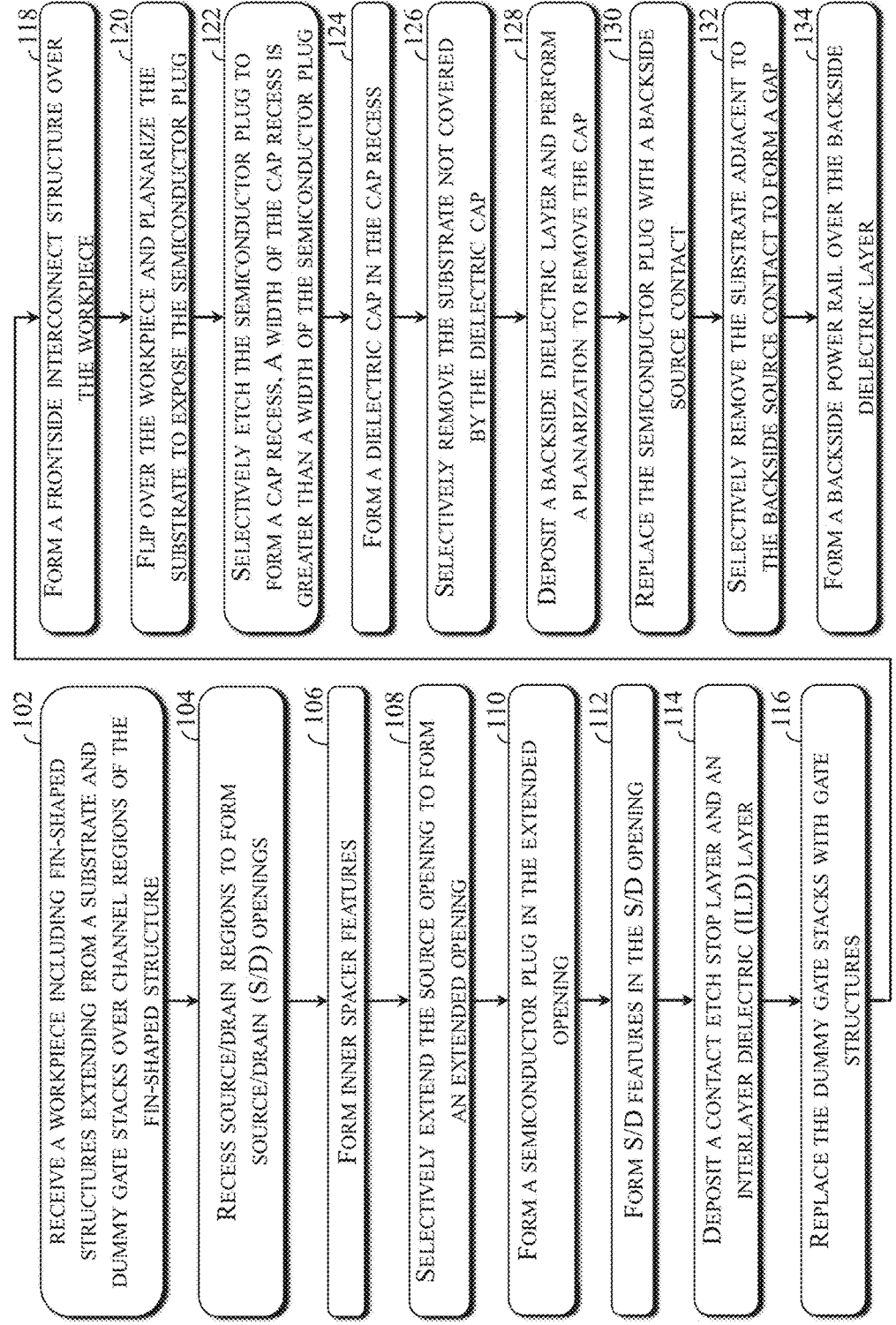
FIG. 1 illustrates a flow chart of a method for forming a semiconductor device having a backside power rail, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming a semiconductor device having a backside source/drain contact, and more particularly to methods of forming a backside source/drain contact that is spaced apart from adjacent structures by a gap.

Source/drain contacts and gate contacts of transistors on a substrate connect source/drain features of the transistors to an interconnect structure over a front side of the substrate. As the dimensions of IC devices shrink, the close proximity among the source/drain contacts and gate contacts may reduce process windows for forming these contacts and may increase parasitic capacitance among them. Backside power rail (BPR) structure is a modern solution to ease the crowding of contacts. In some contact schemes, backside source/ drain contacts may be formed from a back side of the substrate and is coupled to a backside power rail. Due to proximity to adjacent gate structure, parasitic capacitance may exist between the backside source/drain contact and the gate structure. Such parasitic capacitance may impact device performance and reduce switching speed.

The present disclosure provides a method for forming a backside source/drain contact that is spaced apart from adjacent structures by a gap. In an exemplary method, a workpiece is received with its front side facing up. The workpiece includes a source feature and a drain feature over a substrate, a plurality of channel members disposed between the source feature and the drain feature, a gate structure wrapping around the plurality of channel members, and a sacrificial plug disposed in the substrate and directly under the source feature. After flipping over the workpiece and after exposing the sacrificial plug, a hard mask is formed directly over the sacrificial plug and a first portion of the substrate laterally adjacent to the sacrificial plug. The rest of the substrate not covered by the hard mask is replaced by a backside dielectric layer. The sacrificial plug is then replaced by a backside source contact, and the first portion of the substrate is removed to form a gap to space apart the backside source contact from the backside dielectric layer. By forming the gap, the parasitic capacitance between the backside source contact and the gate structure may be advantageously reduced.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-23, which are fragmentary cross-sectional views or fragmentary top views of a workpiece 200 at different stages of fabrication according to embodiments of method 100. Method 100 is merely an example and is not intended to limit the present disclosure to what is explicitly illustrated therein. Additional steps may be provided before, during, and/or after the method 100, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-23 are perpendicular to one another and are used consistently throughout FIGS. 2-23. Throughout the present disclosure, like reference numerals denote like features unless otherwise excepted.

Figure 2:
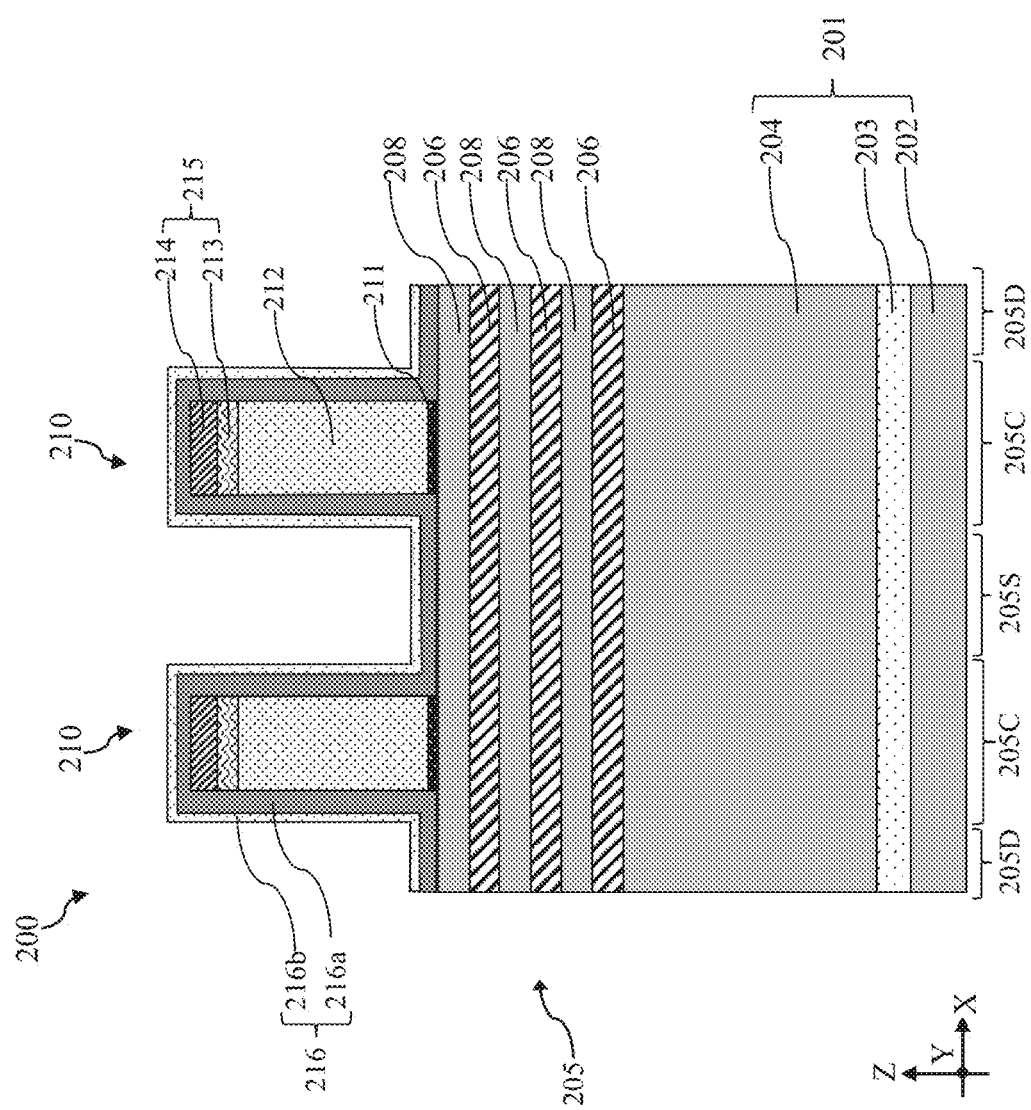
FIGS. 2-23 illustrate fragmentary cross-sectional views and/or top views of a workpiece during various fabrication stages in the method of FIG. 1, according to one or more aspects of the present disclosure.

Referring to FIGS. 1 and 2, method 100 includes a block 102 where a workpiece 200 is received. The workpiece 200 includes a substrate 201. In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AnnAs, AlGaAs, GaInAs, GaInP, GaInAsP, or combinations thereof, or other suitable materials. In some alternative embodiments, the substrate 201 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In this depicted embodiment, the substrate 201 is an SOI substrate and includes a carrier layer 202, an insulator layer 203 on the carrier layer 202, and a semiconductor layer 204 on the insulator layer 203. In some embodiments, the semiconductor layer 204 may be silicon, silicon germanium, germanium, or other suitable materials and may be undoped or unintentionally doped with a very low dose of dopants. In this depicted example, the carrier layer 202 includes silicon, the insulator layer 203 includes silicon oxide, and the semiconductor layer 204 includes silicon (i.e., single-crystalline silicon).

The workpiece 200 includes a fin-shaped structure 205 disposed over the substrate 201. The fin-shaped structure 205 extends lengthwise along the X direction and is divided into channel regions 205C overlapped by dummy gate stacks 210 (to be described below), source regions 205S, and drain regions 205D. In this depicted example, two channel regions 205C, one source region 205S, and two drain regions 205D are shown in FIG. 2, but the workpiece 200 may include more source/drain regions and channel regions. The fin-shaped structure 205 may be formed from a portion of the semiconductor layer 204 and a vertical stack of alternating semiconductor layers 206 and 208 using a combination of lithography and etch steps. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the fin-shaped structure 205 may be performed using double-patterning or multi-patterning processes to create patterns having pitches smaller than what is otherwise obtainable using a single, direct photolithography process. The etching process can include dry etching, wet etching, and/or other suitable processes. In the depicted embodiment, the vertical stack of alternating semiconductor layers 206 and 208 may include a plurality of channel layers 208 interleaved by a plurality of sacrificial layers 206. Each of the channel layers 208 may be formed of silicon (Si) and each of the sacrificial layers 206 may be formed of silicon germanium (SiGe). The channel layers 208 and the sacrificial layers 206 may be epitaxially deposited on the substrate 201 using molecular beam epitaxy (MBE), vapor-phase epitaxy (VPE), ultra-high vacuum CVD (UHV-CVD), and/or other suitable epitaxial growth processes.

While not explicitly shown in FIG. 2, an isolation feature is also formed around the fin-shaped structure 205 to isolate the fin-shaped structure 205 from an adjacent fin-shaped structure. In some embodiments, the isolation feature is deposited in trenches that define the fin-shaped structure 205. Such trenches may extend through the channel layers 208 and sacrificial layers 206 and terminate in the substrate 201. The isolation feature may also be referred to as a shallow trench isolation (STI) feature. In an exemplary process, a dielectric material for the isolation feature is deposited over the workpiece 200 using CVD, subatmospheric CVD (SACVD), flowable CVD (FCVD), physical vapor deposition (PVD), spin-on coating, and/or other suitable process. Then the deposited dielectric material is planarized and recessed until the fin-shaped structure 205 rises above the isolation feature. The dielectric material for the isolation feature may include silicon oxide, silicon oxynitride, fluorine-doped silicate glass (FSG), a low-k dielectric, combinations thereof, and/or other suitable materials.

Still referring to FIG. 2, the workpiece 200 also includes dummy gate stacks 210 disposed over channel regions 205C of the fin-shaped structure 205. The channel regions 205C and the dummy gate stack 210 also define source regions 205S and drain regions 205D that are not vertically overlapped by the dummy gate stacks 210. Each of the channel regions 205C is disposed between a source region 205S and a drain region 205D along the X direction. Two dummy gate stacks 210 are shown in FIG. 2 but the workpiece 200 may include more dummy gate stacks 210. In this embodiment, a gate replacement process (or gate-last process) is adopted where the dummy gate stacks 210 serve as placeholders for functional gate structures. Other processes and configuration are possible. The dummy gate stack 210 includes a dummy dielectric layer 211, a dummy gate electrode layer 212 over the dummy dielectric layer 211, and a gate-top hard mask layer 215 over the dummy gate electrode layer 212. The dummy dielectric layer 211 may include silicon oxide. The dummy gate electrode layer 212 may include polysilicon. The gate-top hard mask layer 215 may be a multi-layer that includes a silicon oxide layer 213 and silicon nitride layer 214 formed on the silicon oxide layer 213. Suitable deposition process, photolithography and etching process may be employed to form the dummy gate stack 210.

As shown in FIG. 2, the workpiece 200 also includes a gate spacer layer 216 disposed over the workpiece 200. In this depicted example, the gate spacer layer 216 includes a first gate spacer layer 216a and a second gate spacer layer 216b deposited conformally over the workpiece 200, including over top surfaces and sidewalls of the dummy gate stacks 210 and top surfaces of the fin-shaped structure 205. The term "conformally" may be used herein for ease of description of a layer having a substantially uniform thickness over various regions. In some implementations, a dielectric constant of the second gate spacer layer 216b is greater than that of the first gate spacer layer 216a, and the second gate spacer layer 216b is more etch resistant than the first gate spacer layer 216a. In some embodiments, the first gate spacer layer 216a may include silicon oxide, silicon oxycarbide, or a suitable low-k dielectric material. The second gate spacer layer 216b may include silicon carbonitride, silicon nitride, zirconium oxide, aluminum oxide, or a suitable dielectric material. The first gate spacer layer 216a and the second gate spacer layer 216b may be deposited over the dummy gate stacks 210 using processes such as, CVD, SACVD, FCVD, atomic layer deposition (ALD), PVD, or other suitable process.

Figure 3:
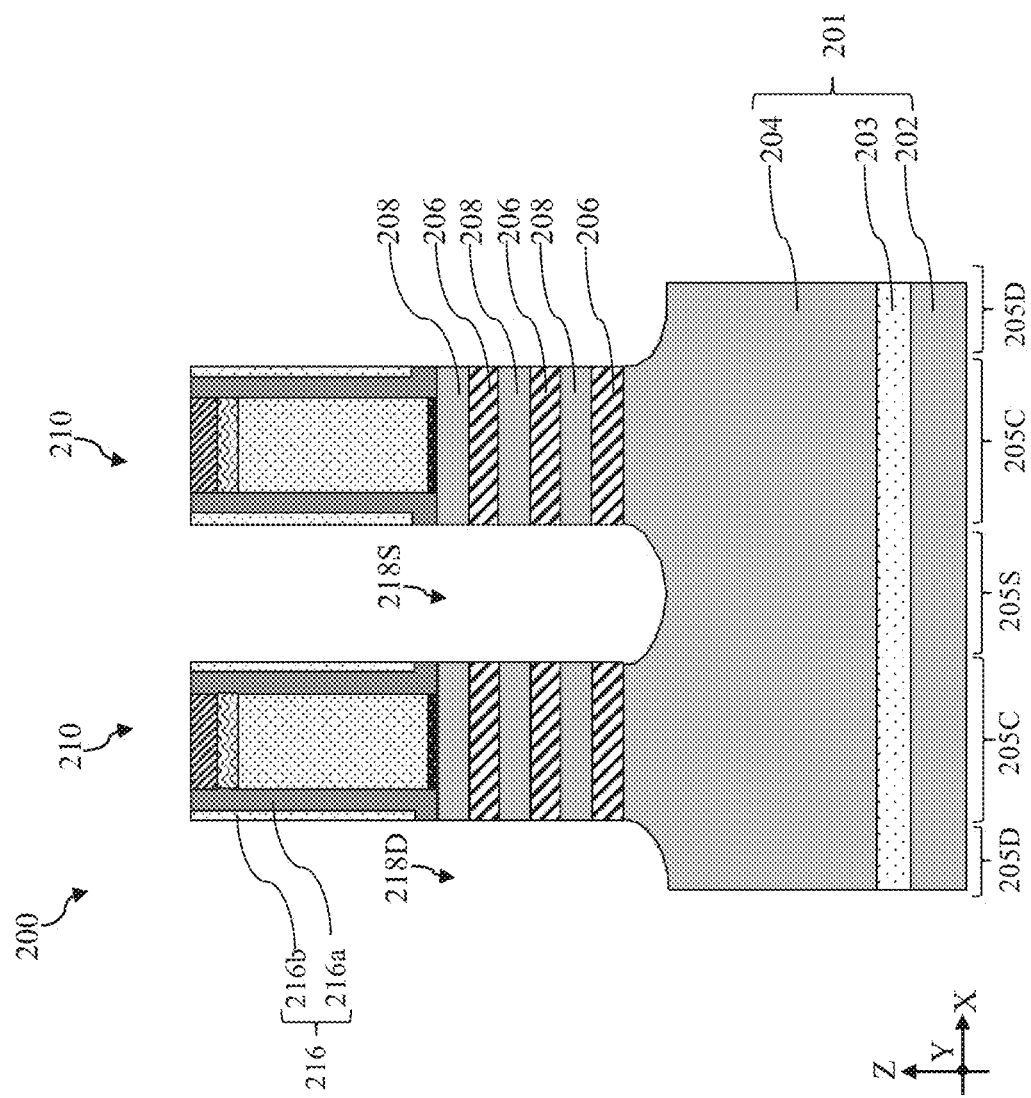

Referring to FIGS. 1 and 3, method 100 includes a block 104 where a source region 205S and two drain regions 205D of the fin-shaped structure 205 are recessed to form a source opening 218S and two drain openings 218D. In some embodiments, the source region 205S and drain regions 205D of the fin-shaped structures 205 that are not covered by the dummy gate stack 210 and the gate spacer layer 216 are anisotropically etched by a dry etch or a suitable etching process to form source opening 218S and two drain openings 218D. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 3, the source opening 218S and drain openings 218D extend through vertical stack of channel layers 208 and sacrificial layers 206. The source opening 218S and the drain openings 218D may partially extend into the semiconductor layer 204 of the substrate 201. As illustrated in FIG. 3, sidewalls of the channel layers 208 and the sacrificial layers 206 are exposed in the source opening 218S and drain openings 218D.

Figure 4:
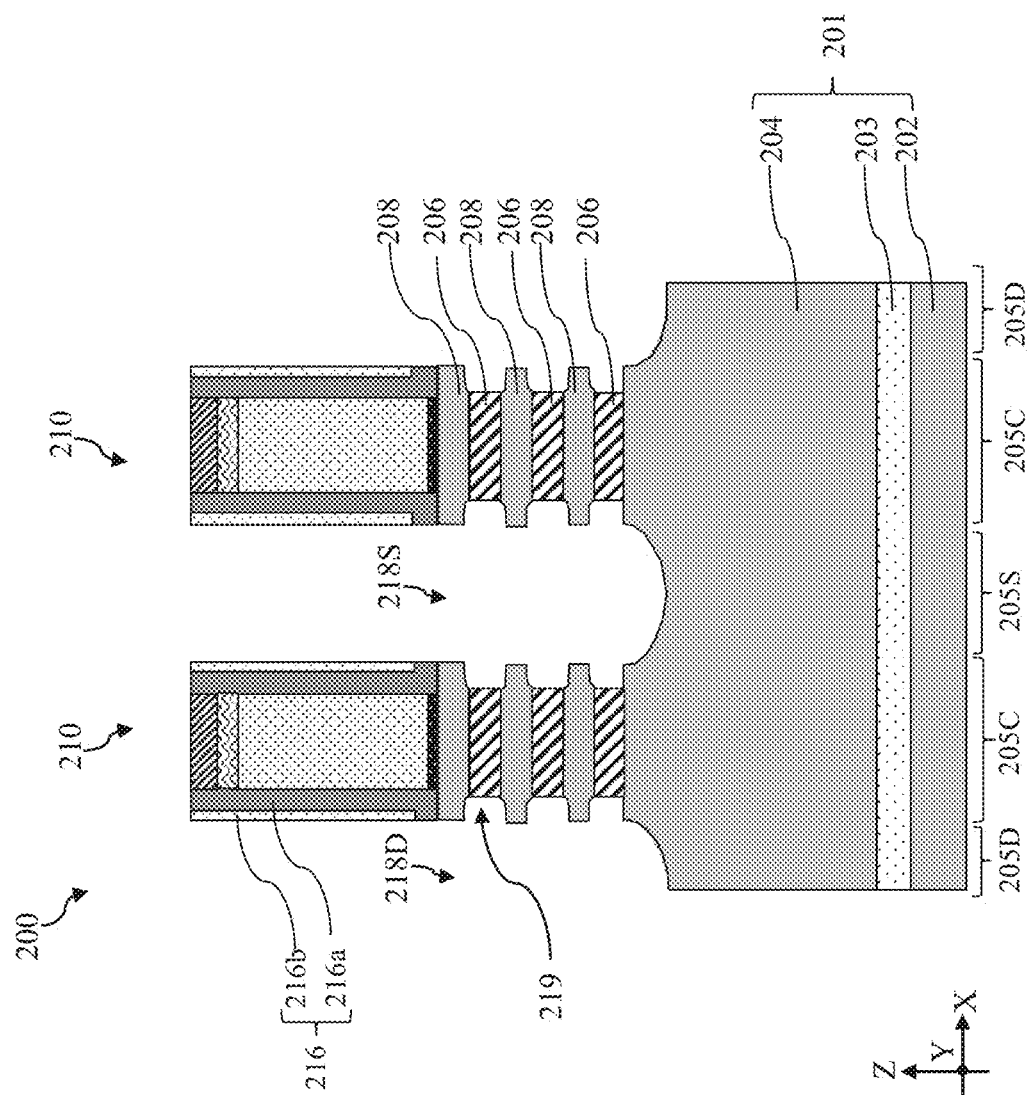
Figure 5:
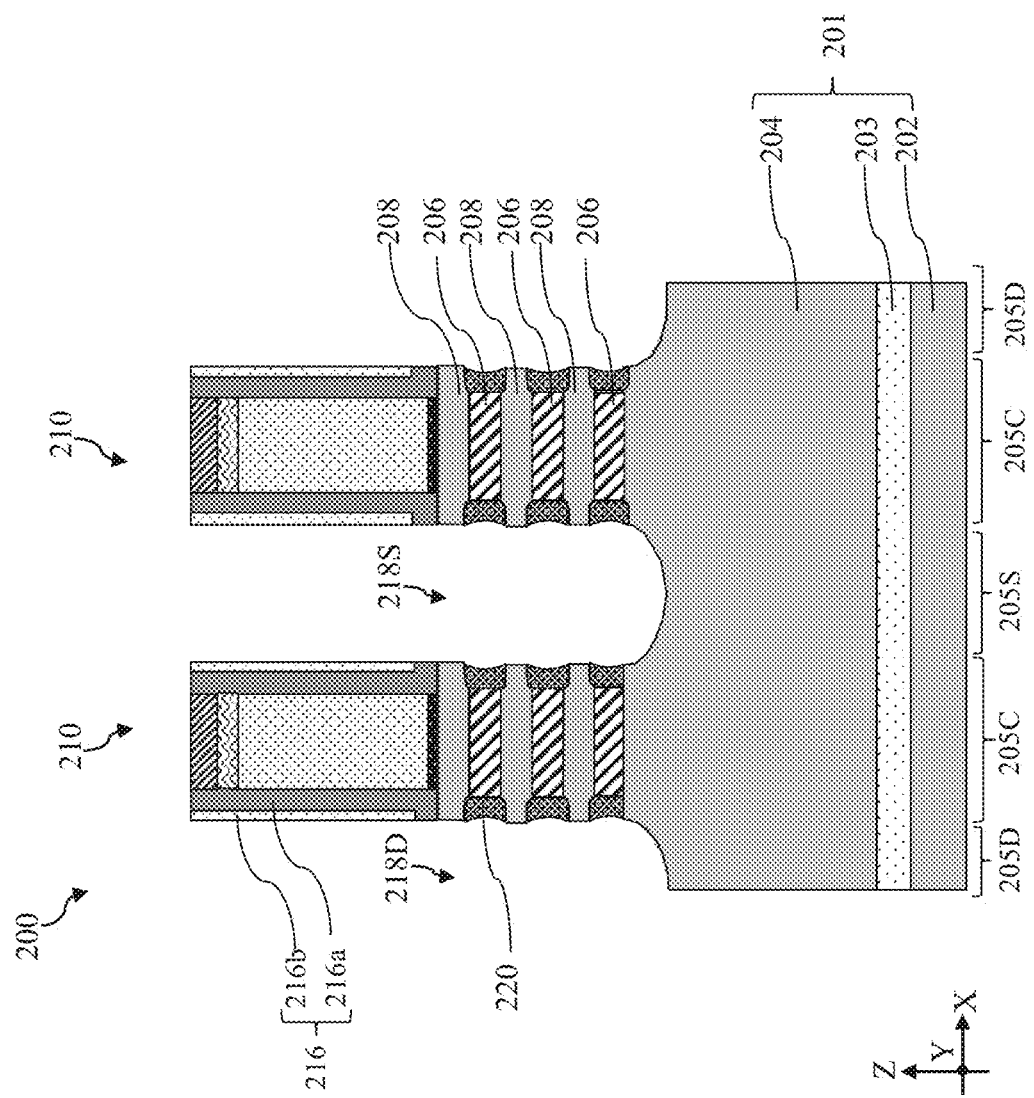

Referring to FIGS. 1 and 4-5, method 100 includes a block 106 where inner spacer features 220 are formed. After the formation of the source opening 218S and the drain openings 218D, the sacrificial layers 206 are exposed in the source opening 218S and the drain openings 218D. As shown in FIG. 4, the sacrificial layers 206 are selectively and partially recessed to form inner spacer recesses 219, while the exposed channel layers 208 are not significantly etched. In an embodiment where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process. After the formation of the inner spacer recesses 219, an inner spacer material layer is deposited over the workpiece 200, including in the inner spacer recesses 219. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excessive inner spacer material layer over sidewalls of the channel layers 208, thereby forming the inner spacer features 220 as shown in FIG. 5. In some embodiments, the etch back process at block 106 may be a dry etching process and in a way similar to the dry etching process used in the formation of the source opening 218S and drain openings 218D.

Figure 6:
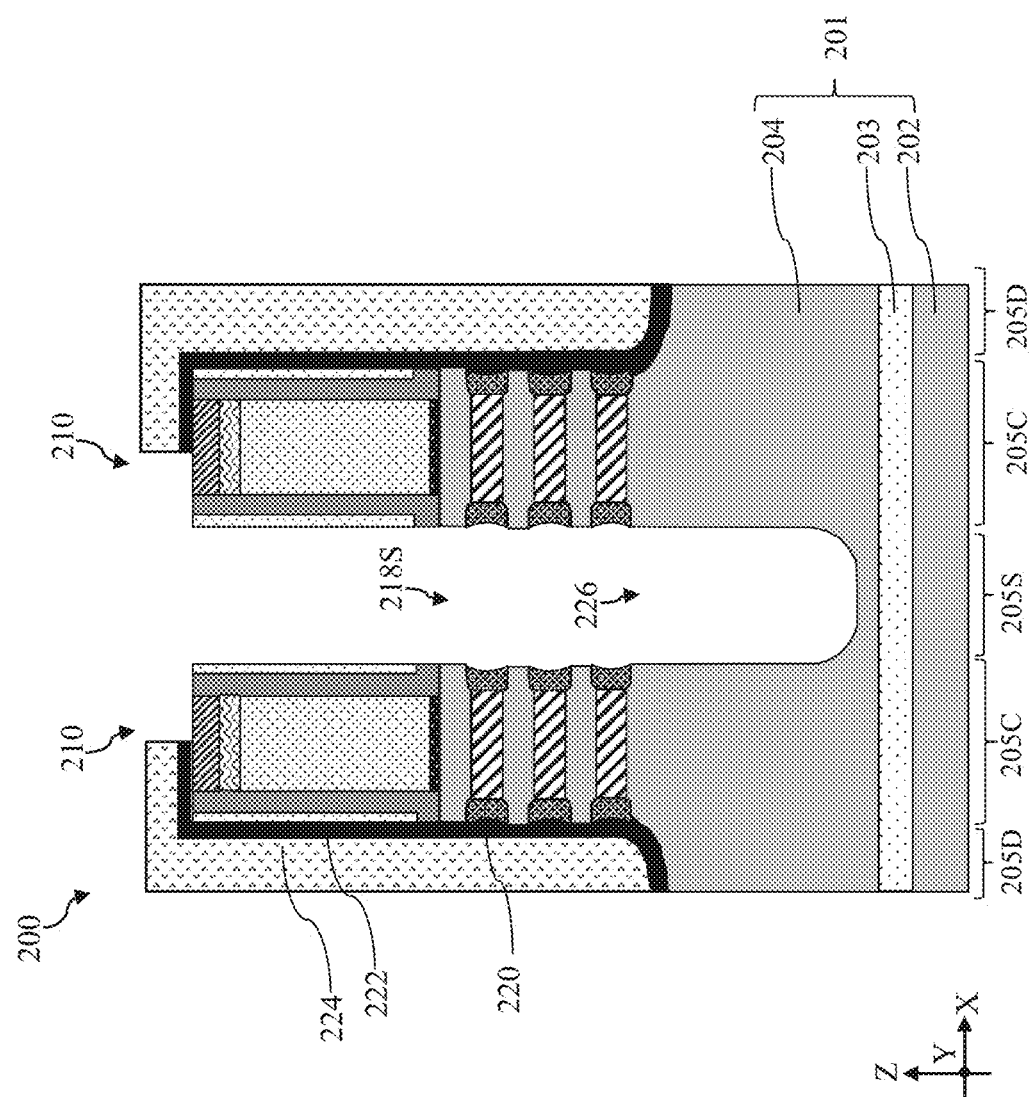

Referring to FIGS. 1 and 6, method 100 includes a block 108 where the source opening 218S is selectively extended into the semiconductor layer 204 to form an extended opening 226. In some embodiments, a mask film 222 is deposited over the workpiece 200 using CVD or ALD and then a photoresist layer 224 is deposited over the mask film 222 using spin-on coating or a suitable process. The photoresist layer 224 is patterned using photolithography process to form a patterned photoresist layer 224. The patterned photoresist layer 224 is then applied as an etch mask in an etching process to pattern the mask film 222. As shown in FIG. 6, the patterned photoresist layer 224 and the patterned mask film 222 cover/protect the drain openings 218D while the source opening 218S is exposed. An etching process is then performed to extend the source opening 218S into the semiconductor layer 204 to form an extended opening 226. In some implementations, the etching process at block 108 may be a dry etching process and in a way similar to the dry etching process used in the formation of the source opening 218S and drain openings 218D. In some embodiments, the mask film 222 may include silicon oxide, silicon nitride, silicon oxynitride, silicon oxycarbonitride, silicon carbide, or silicon oxycarbide.

Figure 7:
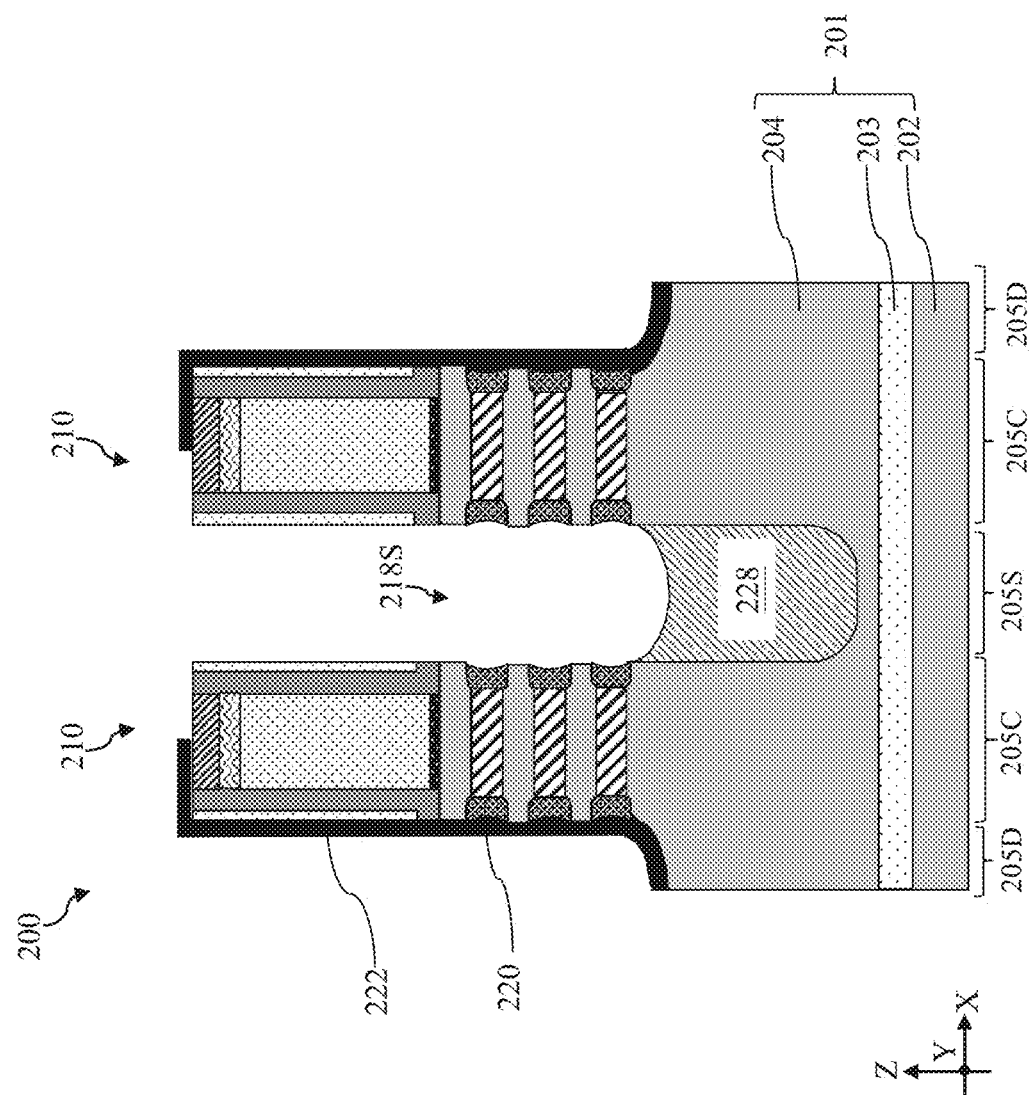

Referring to FIGS. 1 and 7, method 100 includes a block 110 where a semiconductor plug 228 is formed in the extended opening 226. In some embodiments, operations at block 110 may include a pre-clean process to remove native oxide and the photoresist layer 224. After the pre-clean process, with the mask film 222 still covering sidewalls of the drain openings 218D, the semiconductor plug 228 may be selectively formed in the extended opening 226 using molecular beam epitaxy (MBE), vapor-phase epitaxy (VPE), ultra-high vacuum CVD (UHV-CVD)), and/or other suitable epitaxial growth processes. The composition of the semiconductor plug 228 is different from that of the semiconductor layer 204 such that the semiconductor layer 204 may be selectively removed in a subsequent process. For example, when the semiconductor layer 204 is formed of silicon, the semiconductor plug 228 may include SiGe, boron-doped silicon (Si:B), phosphorus-doped silicon (Si: P), boron-doped SiGe (SiGe:B), arsenic-doped silicon (Si: As) or other suitable material such that the semiconductor layer 204 may be selectively removed without substantially etching the semiconductor plug 228. In an embodiment, the semiconductor layer 204 is formed of silicon and the semiconductor plug 228 is formed of SiGe. After the formation of the semiconductor plug 228, the mask film 222 covering the drain openings 218D is selectively removed using a suitable etching process.

Figure 8:
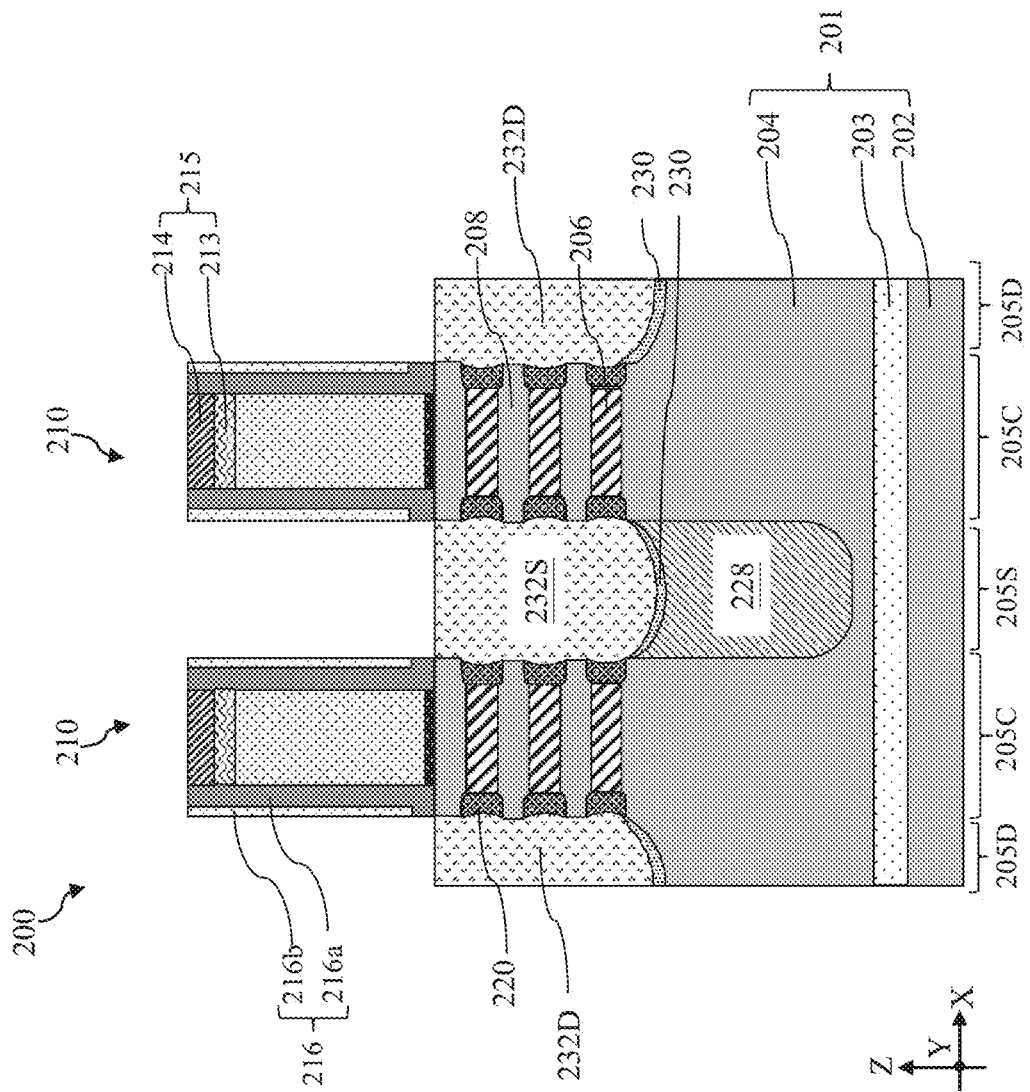

Referring to FIGS. 1 and 8, method 100 includes a block 112 where a source feature 232S is formed in the source opening 218S and a drain feature 232D is formed in the drain opening 218D. In this illustrated example, after removing the mask film 222, an epitaxial semiconductor feature 230 is formed at the bottom of the source opening 218S (and over the semiconductor plug 228) and at the bottom of the drain openings 218D to reduce or substantially prevent a leakage between the to-be-formed source/drain features 232S/232D and the semiconductor layer 204 and/or features to be formed at the backside of the workpiece 200. The epitaxial semiconductor feature 230 may be epitaxially and selectively formed from the exposed top surfaces of the semiconductor layer 204 or the semiconductor plug 228 by using an epitaxial process, such as an MBE process, a VPE process, an UHV-CVD process, an MOCVD process, and/or other suitable epitaxial growth processes. A bottom surface of the epitaxial semiconductor feature 230 generally tracks the shape of the bottom surface of the drain openings 218D or the exposed top surface of the semiconductor plug 228. Because surfaces of the inner spacer features 220 are not conducive to epitaxial deposition of the epitaxial semiconductor feature 230, the epitaxial semiconductor feature 230 is formed in a bottom-up fashion from the exposed surface of the substrate 201. A cross-sectional view of the epitaxial semiconductor feature 230 includes a crescent shape. Depending on the conductivity type of the source feature 232S, the epitaxial semiconductor feature 230 may have different compositions. When the source feature 232S is n-type, the epitaxial semiconductor feature 230 may include undoped silicon (Si), phosphorus-doped silicon (Si:P), or arsenic-doped silicon (Si:As). When the source feature 232S is p-type, the epitaxial semiconductor feature 230 may include undoped silicon germanium (SiGe) or boron-doped silicon germanium (SiGe:B).

The source feature 232S and the drain feature 232D each may be then formed over the epitaxial semiconductor feature 230 by using an epitaxial process, such as VPE, UHV-CVD, MBE, and/or other suitable processes. The epitaxial process may use gaseous and/or liquid precursors, which interact with the composition of the epitaxial semiconductor feature 230. The source feature 232S and the drain feature 232D are therefore coupled to the channel layers 208 in the channel regions 205C of the fin-shape structure 205. Depending on the conductivity type of the to-be-formed transistor, the source feature 232S and the drain feature 232D may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. In some embodiments, a lightly doped epitaxy semiconductor layer may be formed between the source/drain feature 232S/232D and the corresponding epitaxial semiconductor feature 230, and a doping concentration of the lightly doped epitaxy semiconductor layer is less than a doping concentration of the source/drain feature 232S/232D.

Figure 9:
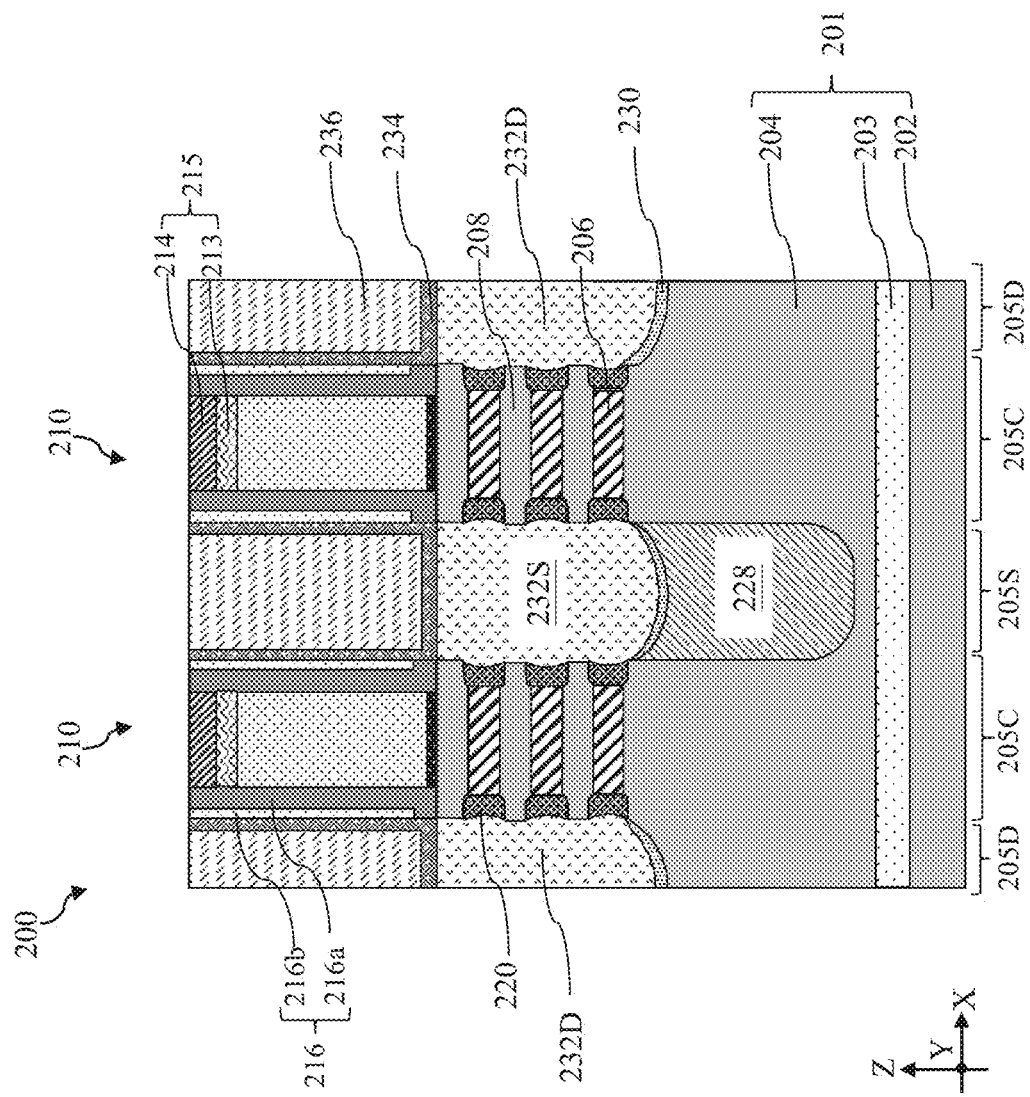

Referring to FIGS. 1 and 9, method 100 includes a block 114 where a contact etch stop layer (CESL) 234 and an interlayer dielectric (ILD) layer 236 are deposited over the workpiece 200. The CESL 234 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 9, the CESL 234 may be deposited on top surfaces of the source feature 232S, the drain features 232D, and sidewalls of the gate spacer layer 216. The ILD layer 236 is deposited by a PECVD process or other suitable deposition technique over the workpiece 200 after the deposition of the CESL 234. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the ILD layer 236, the workpiece 200 may be annealed to improve integrity of the ILD layer 236.

Figure 10:
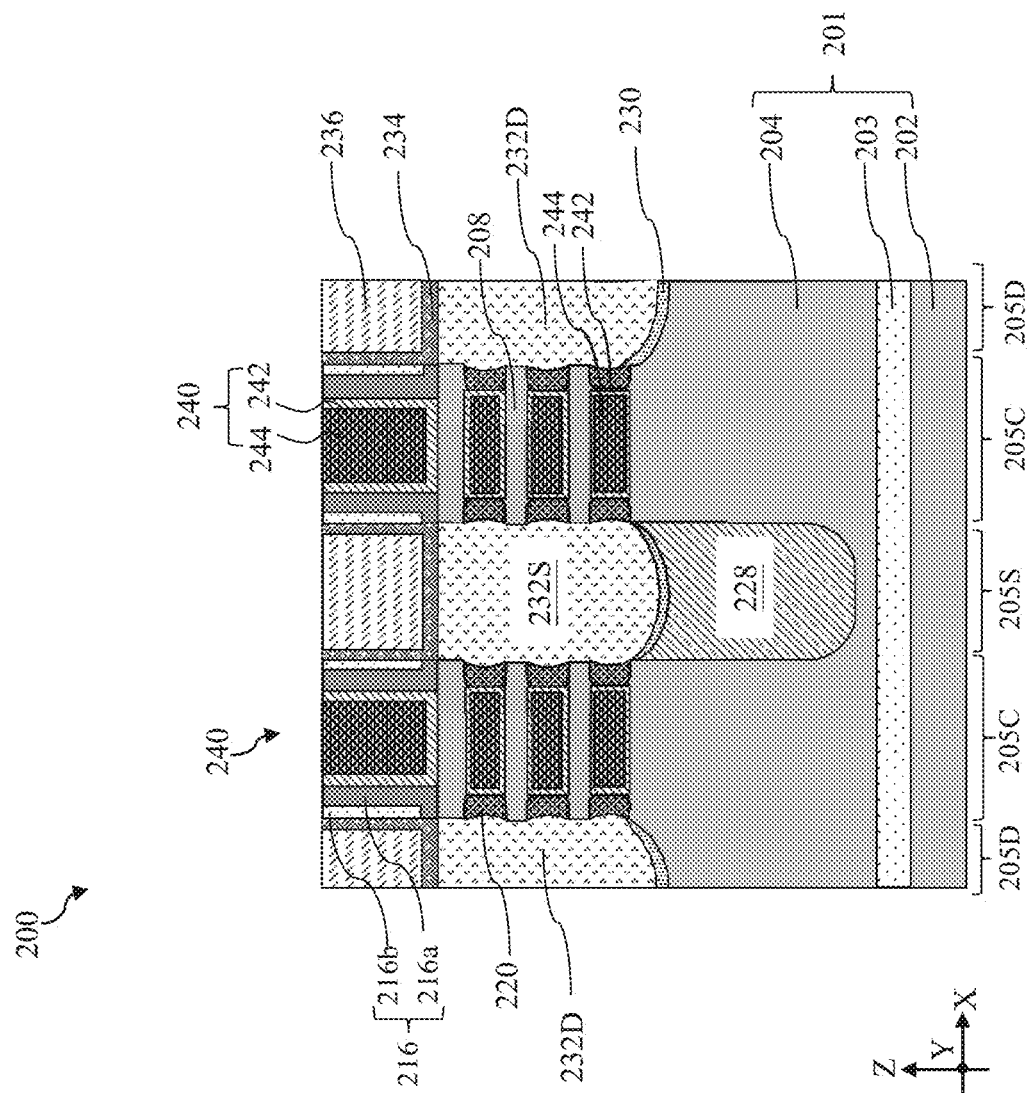

Referring to FIGS. 1 and 10, method 100 includes a block 116 where the dummy gate stacks 210 are replaced with the gate structures 240. A planarization process, such a chemical mechanical polishing (CMP) process may be performed to the workpiece 200 to remove excessive materials and expose top surfaces of the dummy gate electrode layer 212 in the dummy gate stacks 210. With the exposure of the dummy gate electrode layer 212, block 116 proceeds to removal of the dummy gate stacks 210. The removal of the dummy gate stacks 210 may include one or more etching process that are selective to the material in the dummy gate stacks 210. For example, the removal of the dummy gate stacks 210 may be performed using a selective wet etch, a selective dry etch, or a combination thereof. After the removal of the dummy gate stacks 210, the sacrificial layers 206 are selectively removed to release the channel layers 208 as channel members 208 in the channel regions 205C. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture).

The gate structures 240 are deposited to wrap over the channel members 208. Each of the gate structures 240 includes a gate dielectric layer 242 and a gate electrode layer 244 over the gate dielectric layer 242. In some embodiments, the gate dielectric layer 242 includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. A low-k dielectric layer refers to a dielectric material having a dielectric constant no greater than that of silicon dioxide. In some embodiments, the interfacial layer includes silicon oxide. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode layer 244 is then deposited over the gate dielectric layer 242 using ALD, PVD, CVD, e-beam evaporation, or other suitable methods. The gate electrode layer 244 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 244 may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers).

Figure 11:
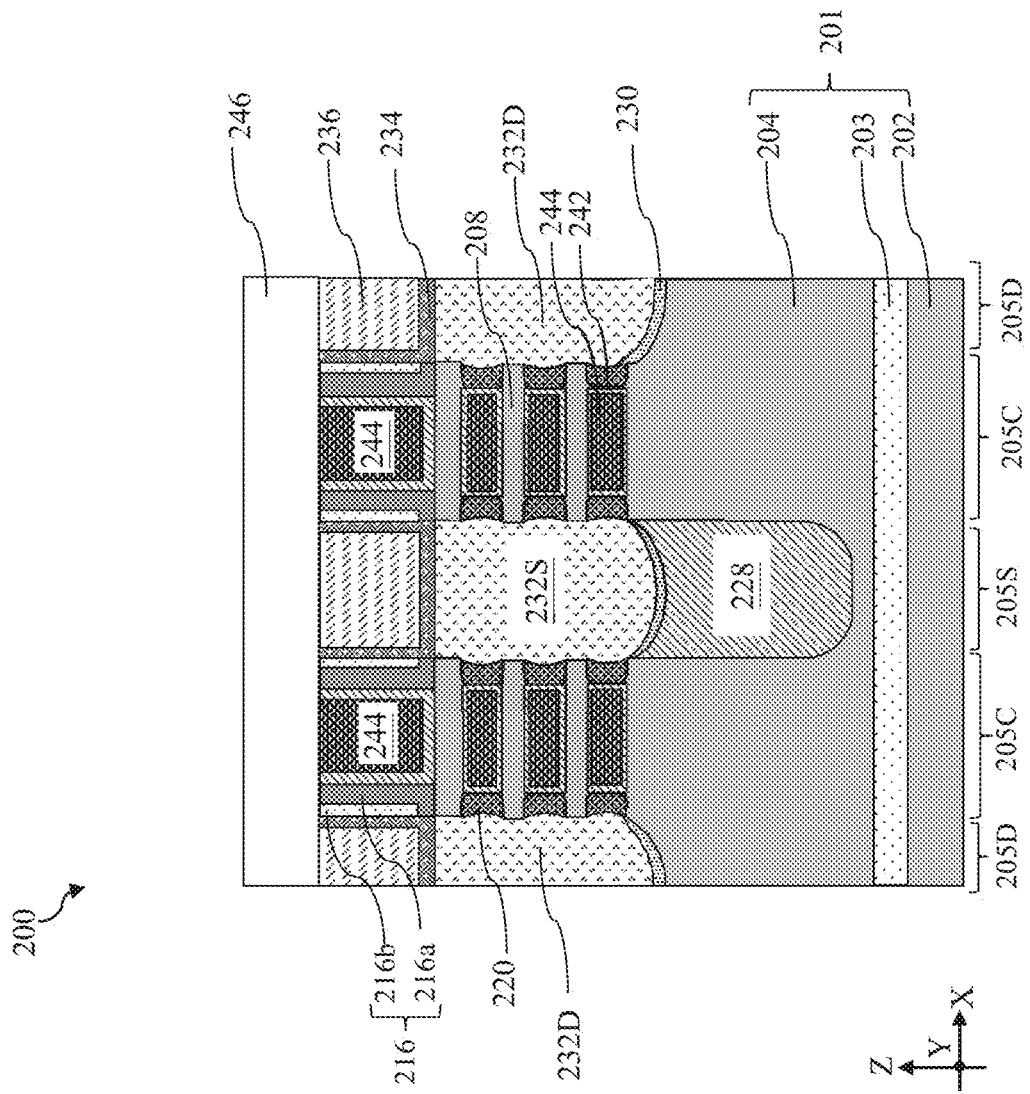

Referring to FIGS. 1 and 11, method 100 includes a block 118 where a first interconnect structure 246 is formed over the workpiece 200. In some embodiments, the first interconnect structure 246 may include multiple intermetal dielectric (IMD) layers and multiple metal lines or contact vias in each of the IMD layers. In some instances, the IMD layers and the ILD layer 236 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers and to prevent electro-migration. Because the first interconnect structure 246 is formed over the front side of the workpiece 200, the first interconnect structure 246 may also be referred to as a frontside interconnect structure 246.

Figure 12:
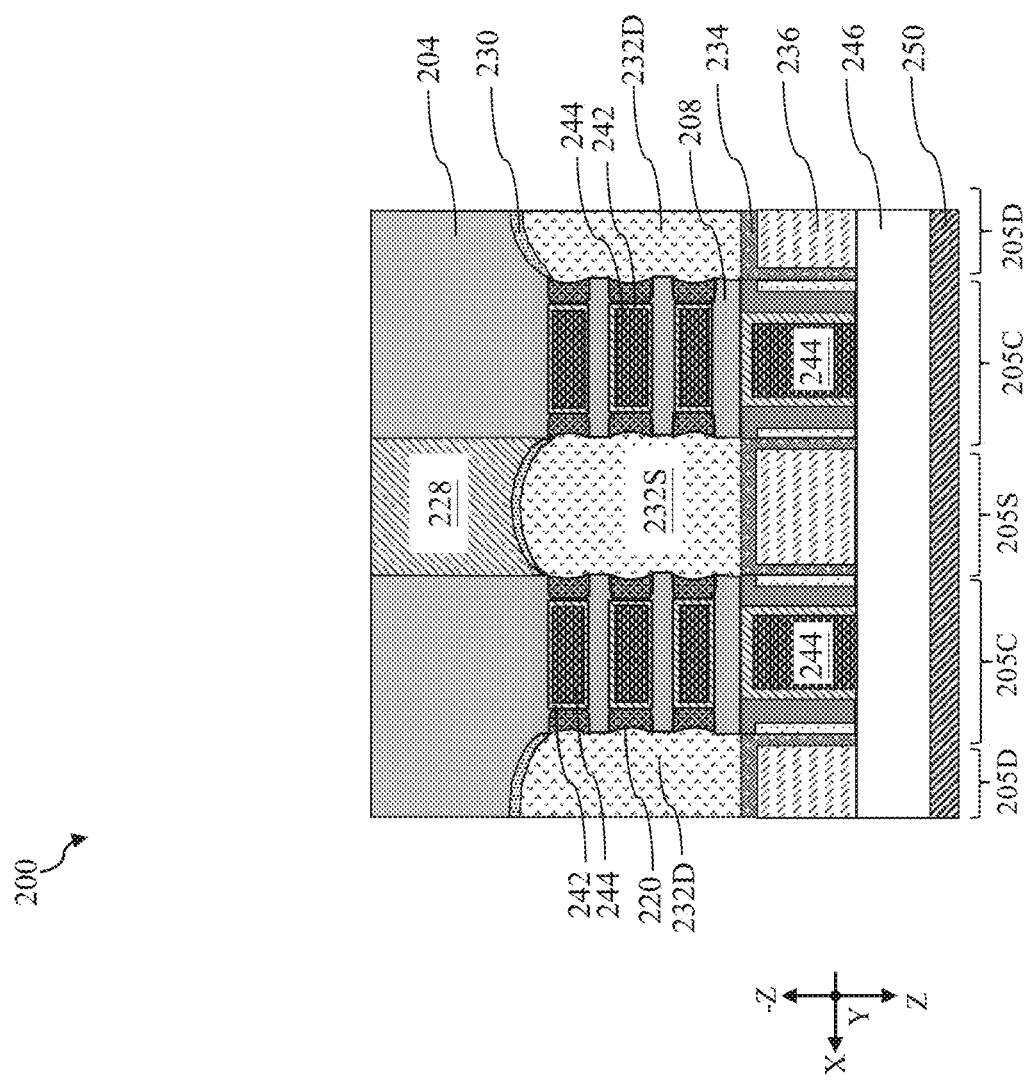

Referring to FIGS. 1 and 12, method 100 includes a block 120 where a carrier substrate 250 is bonded to the first interconnect structure 246 and the workpiece 200 is flipped over and planarized to expose the semiconductor plug 228. In some embodiments, the carrier substrate 250 may be bonded to the workpiece 200 by fusion bonding, by use of an adhesion layer, or a combination thereof. In some instances, the carrier substrate 250 may include semiconductor materials (such as silicon), sapphire, glass, polymeric materials, or other suitable materials. In embodiments where fusion bonding is used, the carrier substrate 250 includes a bottom oxide layer and the first interconnect structure 246 includes a top oxide layer. After both the bottom oxide layer and top oxide layer are treated, they are placed in plush contact with one another for direct bonding at room temperature or at an elevated temperature. Once the carrier substrate 250 is bonded to the first interconnect structure 246 of the workpiece 200, the workpiece 200 is flipped over. The back side of the workpiece 200 is then planarized to remove the carrier layer 202, the insulator layer 203, and a portion of the semiconductor layer 204 to expose the semiconductor plug 228. As shown in FIG. 12, the semiconductor layer 204 of the substrate 201 is disposed over the channel members 208.

Figure 13:
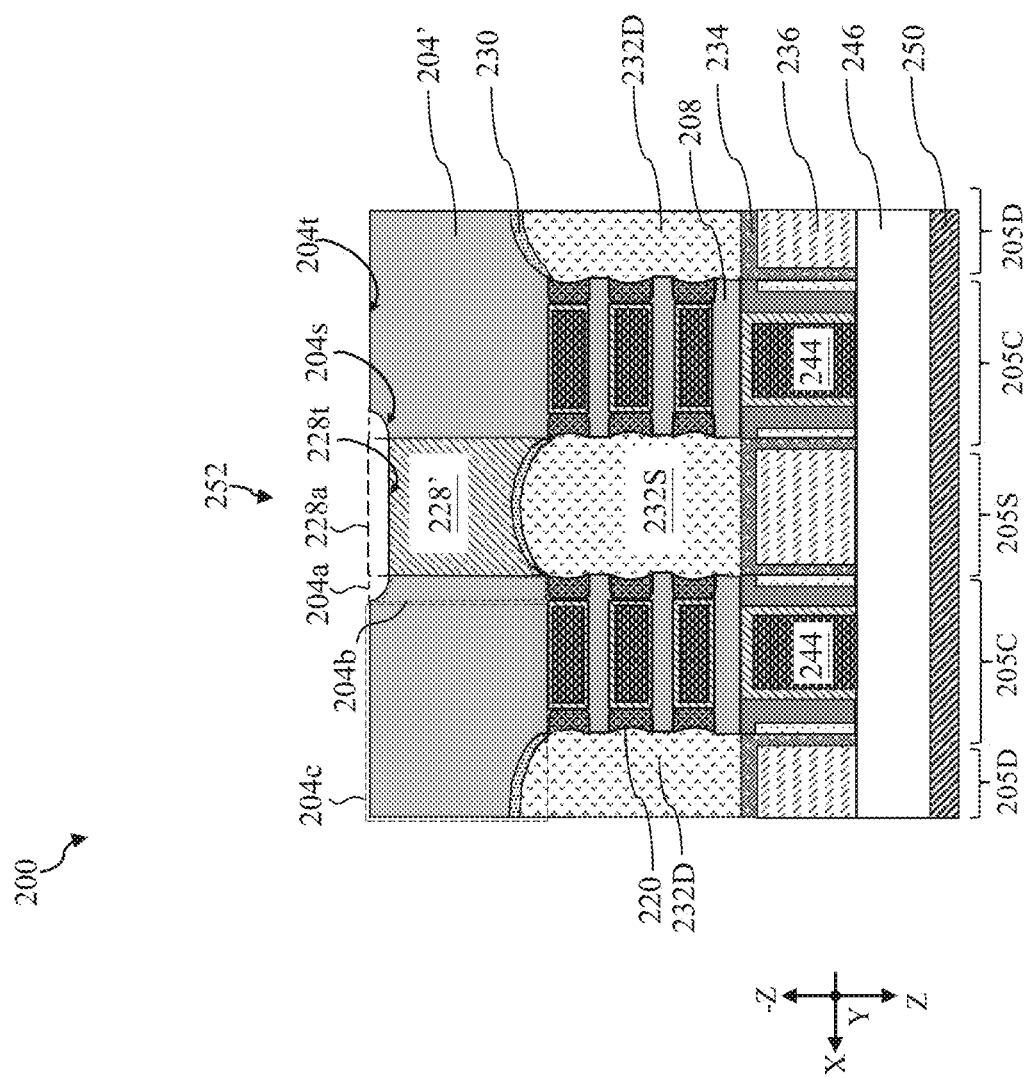

Referring to FIGS. 1 and 13, method 100 includes a block 122 where the semiconductor plug 228 and the substrate 201 are partially and selectively etched to form a cap recess 252. The cap recess 252 may be formed by performing one or more selective dry etching processes, one or more selective wet etching processes, and/or combinations thereof. In this present embodiment, a wet etching process is implemented to selectively remove an upper portion 228a of the semiconductor plug 228. By adjusting the concentration of the etchant implemented in this wet etching process, a first portion 204a of the semiconductor layer 204 around the upper portion 228a of the semiconductor plug 228 is also intentionally removed. It is noted that, the etchant solution etches the upper portion 228a of the semiconductor plug 228 at a first rate greater than a second rate associated with the etching of the first portion 204a of the semiconductor layer 204.

In this depicted example, the semiconductor layer 204 is formed of silicon, the semiconductor plug 228 is formed of silicon germanium, and the wet etching process implements an etchant solution that includes a mixture of ammonium hydroxide ($NH_4OH$), hydrogen peroxide ($H_2O_2$), and water ($H_2O$). The extent at which the semiconductor plug 228 is recessed may be controlled by duration of the etching process. In an embodiment, a concentration of the hydrogen peroxide ($H_2O_2$) in the etchant solution may be between about 5% and about 10% to intentionally remove the first portion 204a of the semiconductor layer 204. The process temperature may be between about 50° C. and about 60° C. It is noted that, due to the selection of the mixture of ammonium hydroxide ($NH_4OH$), hydrogen peroxide ($H_2O_2$), and water ($H_2O$) and due to the lattice structure of silicon, the etchant solution etches silicon more slowly along the <111> crystal orientation than all the other crystal orientations (e.g., <110>, <100>) in the lattice. As a result, the partially etched semiconductor layer 204 (may also be referred to as semiconductor layer 204') includes a second portion 204b having a curved surface 204s and a third portion 204c having a substantially flat surface 204t. After performing the wet etching process, the cap recess 252 that is defined by a top surface 228t of the partially etched semiconductor plug 228 (may also be referred to as semiconductor plug 228') and the curved surface 204s is formed. Other suitable chemicals that have a high selectivity between the semiconductor plug 228 and the semiconductor layer 204 may also be used to selectively etch the semiconductor plug 228 to form the cap recess 252. It is noticed that, by employing the selective wet etching process, the cap recess 252 is formed without employing a lithography process.

In some implementations, other methods may be employed to form the cap recess 252. For example, a first dry etching may be implemented to selectively recess the semiconductor plug 228 to form the semiconductor plug 228' without significantly etching the semiconductor layer 204. The first dry etching process forms an opening with a uniform width along the Z direction. A bottom anti-reflective coating (BARC) layer may be deposited over the workpiece 200. The BARC layer is then etched back (e.g., by a blanket etch) to expose the first portion 204a of the semiconductor layer 204 while the semiconductor plug 228' is still protected by the BARC layer. A second dry etching may be then performed to remove the first portion 204a of the semiconductor layer 204 to enlarge the opening to form the cap recess 252. It is understood that, due to different characteristics of different etching processes, the shape of a cross-sectional view of the cap recess 252 may be slightly different, and cap recess 252 would still expose a satisfactory portion of the semiconductor layer 204 adjacent to the semiconductor plug 228'.

Figure 14:
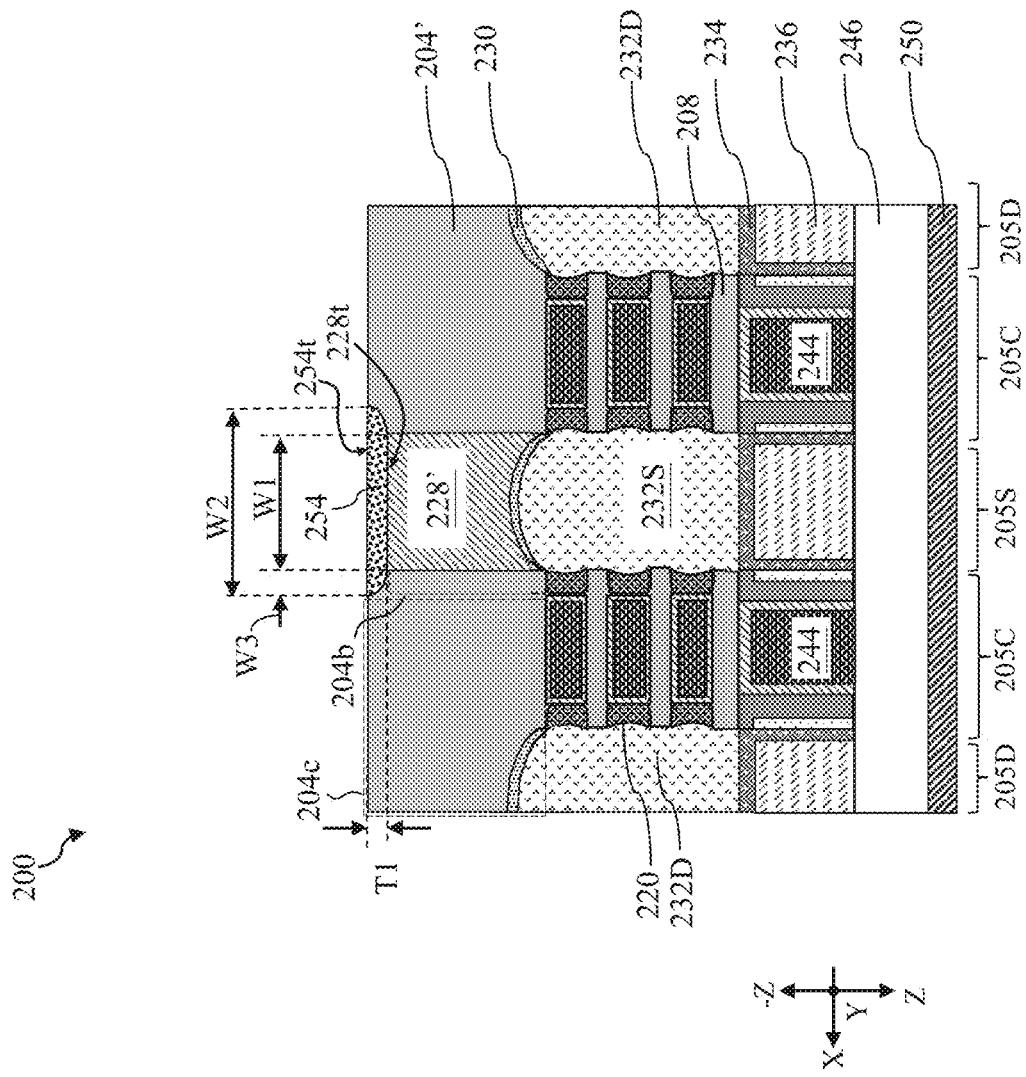

Referring to FIGS. 1 and 14, method 100 includes a block 124 where a self-aligned dielectric cap 254 is formed in the cap recess 252. The formation of the dielectric cap 254 may include depositing a dielectric material on the workpiece 200 to fill the cap recesses 252. The dielectric material may be deposited using high-density-plasma CVD (HDPCVD), PECVD, ALD, or a suitable deposition process. The dielectric material may be formed of silicon oxide, silicon nitride, silicon oxynitride, silicon carbide, aluminum oxide, or combinations thereof. A planarization process, such as a chemical mechanical planarization (CMP) process, may follow to remove excessive dielectric material over the surface 204t, define a final shape of the dielectric cap 254, and provide a planar surface. The dielectric cap 254 tracks the shape of the cap recess 252. That is, the dielectric cap 254 includes a bottom surface in direct contact with the top surface 228t of the semiconductor plug 228', a curved sidewall in direct contact with the curved surface 204s, and a planar top surface 254t. A center line (not shown) of the dielectric cap 254 aligns with a center line (not shown) of the semiconductor plug 228'.

The top surface 228t of the semiconductor plug 228' (and thus the bottom surface of the dielectric cap 254) has a width W1 along the X direction. The top surface 254t of the dielectric cap 254 has a width W2 along the X direction and is greater than W1. When viewed from the Y direction, besides being directly disposed over the semiconductor plug 228', the dielectric cap 254 is also disposed directly over the second portion 204b of the semiconductor layer 204' that is laterally adjacent to and around the semiconductor plug 228'. The distance between the edge of the top surface 254t of the dielectric cap 254 and the sidewall of the semiconductor plug 228' is marked as W3, W3 is equal to one half of the width difference between W2 and W1. In other words, W3 is equal to (W2−W1)/2. The dielectric cap 254 also has a thickness T1 along the Z direction. In some instances, in order for the dielectric cap 254 to withstand the etching at block 126, W1 is between about 15 nm and about 25 nm, W2 is between about 25 nm and about 35 nm, W3 is between about 4 nm and about 6 nm, and T1 is between about 10 nm and about 20 nm.

Figure 15:
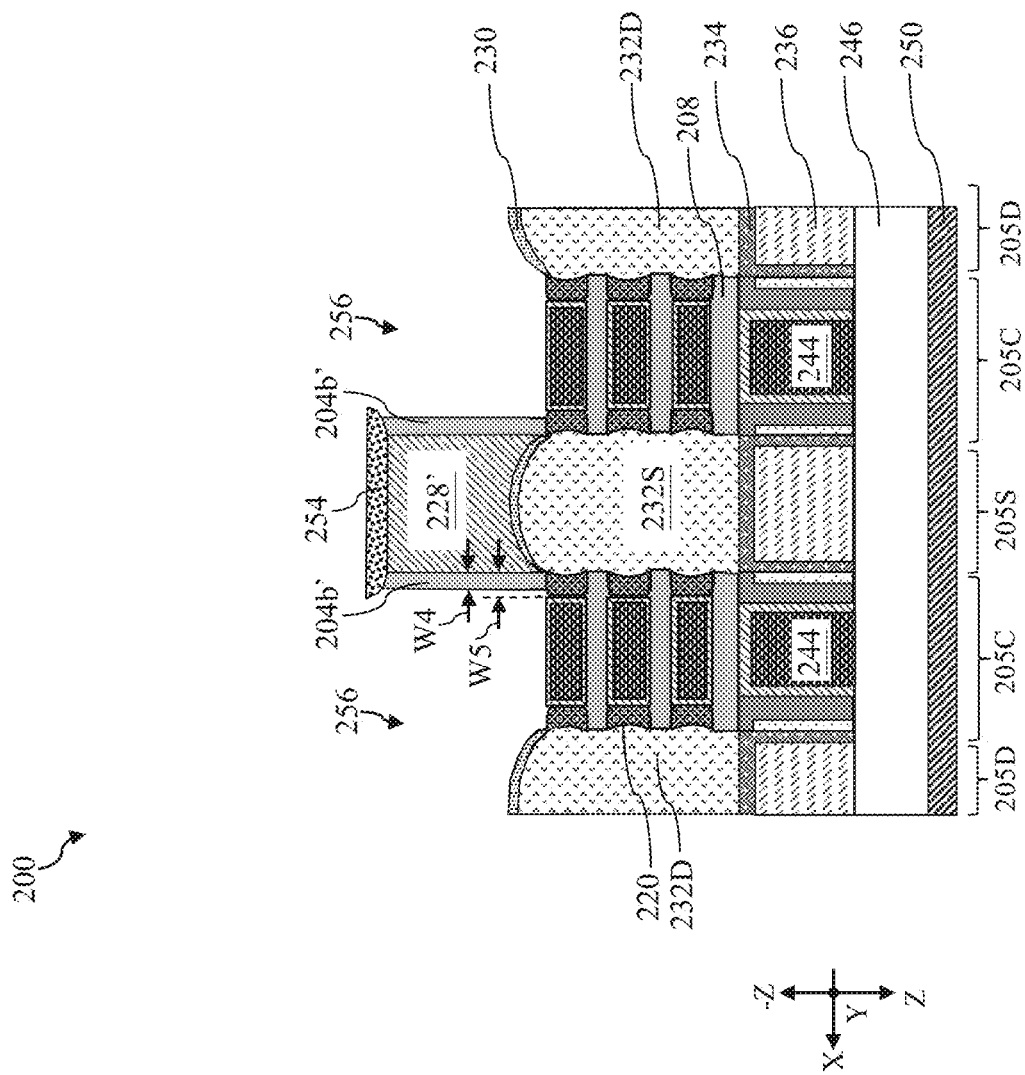

Referring to FIGS. 1 and 15, method 100 includes a block 126 where the semiconductor layer 204' not covered by the dielectric cap 254 is selectively removed to form a dielectric opening 256. In some embodiments, after the formation of the dielectric cap 254, the third portion 204c of the semiconductor layer 204' may be selectively removed to form the dielectric opening 256 by a selective etching process, such as a selective wet etching process or a selective dry etching process. An exemplary selective dry etching process may implement $CF_4$, $NF_3$, $Cl_2$, HBr, other suitable gases and/or plasmas, and/or combinations thereof. As shown in FIG. 15, the selective removal at block 126 does not substantially damage the semiconductor plug 228'. The second portion 204b of the semiconductor layer 204' under the dielectric cap 254 may be slightly etched during the selective removal of the semiconductor layer 204' but largely remains. The slightly etched portion 204b of the semiconductor layer 204' may be referred to as the semiconductor layer 204b' or semiconductor liner 204b'. The semiconductor liner 204b' extends along the sidewall of the semiconductor plug 228'. After the etching process at block 126, the semiconductor liner 204b' has a width W4 along the X direction. The inner spacer feature 220 has a width W5 along the X direction, and W5 is greater than W4. That is, the semiconductor liner 204b' is disposed on inner spacer feature 220 and is not directly over the gate structure 240. Therefore, in a subsequent etching process of removing the semiconductor liner 204b', the gate structure 240 would not be exposed and damaged. As semiconductor liner 204b' was part of the substrate and was laterally adjacent to the semiconductor plug 228', the semiconductor liner 204b' does not extend over the source feature 232S, the semiconductor liner 204b' also steers clear from the source feature 232S.

Figure 16:
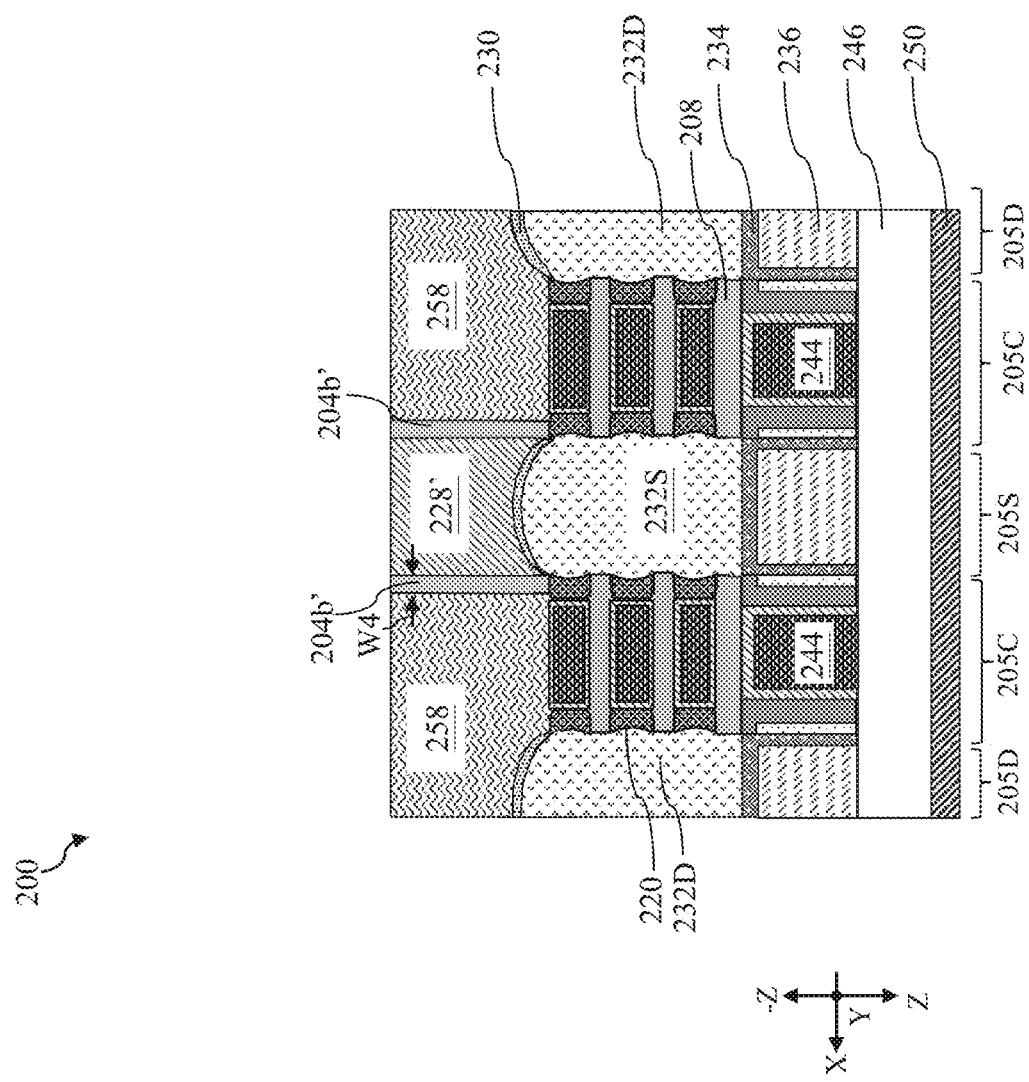
Figure 17:
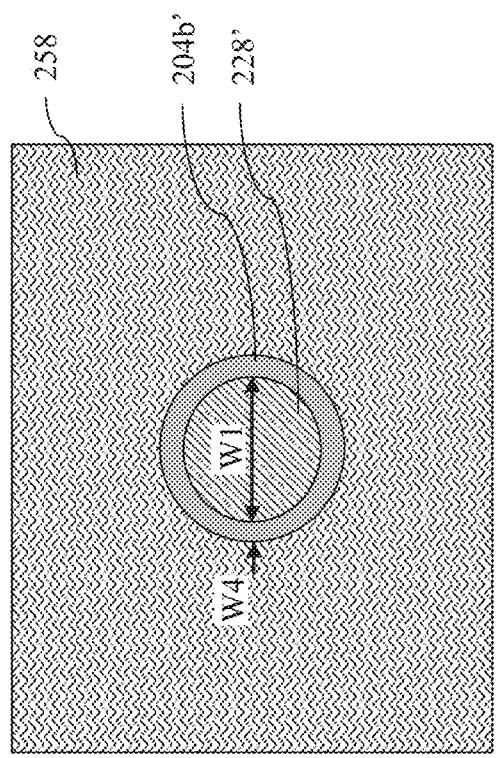

Referring to FIGS. 1 and 16-17, method 100 includes a block 128 where a dielectric layer 258 is formed in the dielectric opening 256 and over the workpiece 200. The dielectric layer 258 may be deposited over the back side of the workpiece 200 by FCVD, CVD, PECVD, spin-on coating, or a suitable process. In some instances, the dielectric layer 258 may include silicon oxide or have a composition similar to that of the ILD layer 236. As shown in FIG. 16, after the dielectric layer 258 is formed, the drain features 232D are spaced apart from the dielectric layer 258 by the epitaxial semiconductor feature 230. A planarization process, such as a CMP process, may be performed to planarize the back side of the workpiece 200, remove excessive dielectric layer 258 over the dielectric cap 254, remove the dielectric cap 254, and expose the semiconductor plug 228' and the semiconductor liner 204b'. FIG. 17 depicts an exemplary fragmentary top view of the workpiece 200 after the planarization process. In this present embodiment, a shape of a top view of the semiconductor plug 228' includes a substantially round shape and has a width W1 (or diameter W1) along the X direction. A shape of a top view of the semiconductor liner 204b' includes or resembles a disc shape or a donut shape. The semiconductor liner 204b' has the width W4 along the X direction and wraps around the semiconductor plug 228'. It is understood that the shape of the top view of the semiconductor plug 228' is not limited to the substantially round shape and the shape of a top view of the semiconductor liner 204b' is not limited to the disc shape.

Figure 18:
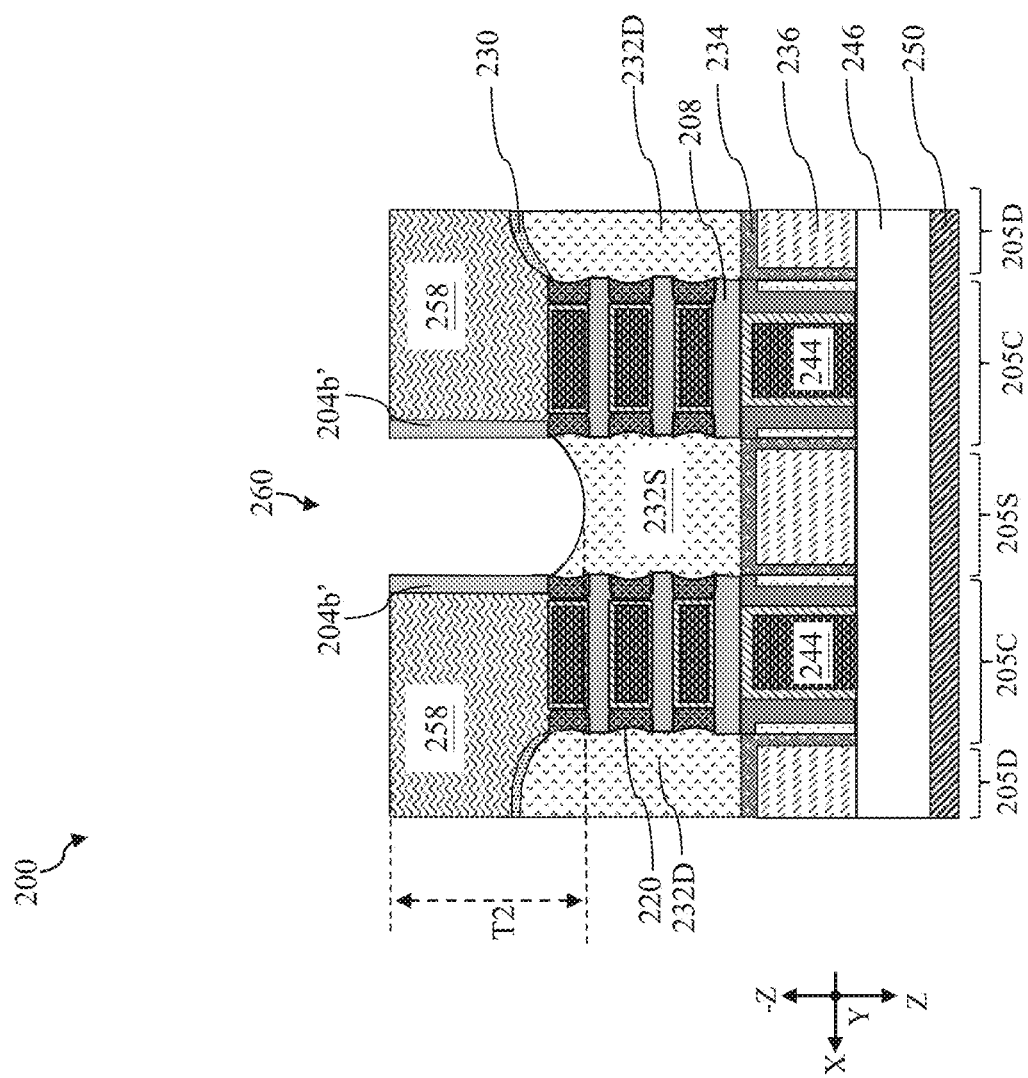

Referring to FIGS. 1 and 18-20, method 100 includes a block 130 where the recessed semiconductor plug 228' is replaced with a backside source contact 266. Referring to FIG. 18, the semiconductor plug 228' is selectively removed without substantially damaging the dielectric layer 258 or the semiconductor liner 204b' by performing an etching process. The etching process is stopped when the semiconductor plug 228' is removed and the source feature 232S is exposed in a backside source contact opening 260 from the back side of the workpiece 200. The backside source contact opening 260 has a depth T3 along the Z direction. A ratio of the thickness T1 (shown in FIG. 14) of the dielectric cap 254 to the depth T3 of the backside source contact opening 260 is between about 0.1 and 0.2 such that the final semiconductor device 200 would provide a satisfactory backside source contact having a satisfactory height and would provide a satisfactory parasitic capacitance between the to-be-formed backside power rail 270 (shown in FIG. 23) and the gate structure 240.

The selective removal of the semiconductor plug 228' is self-aligned. In these embodiments, the selective removal of the semiconductor plug 228' may be performed using a selective wet etching process or a selective dry etching process. In an embodiment, the selective wet etching process employs the etchant solution that includes a mixture of ammonia hydroxide ($NH_4OH$), hydrogen peroxide ($H_2O_2$), and water ($H_2O$) to selectively remove the semiconductor plug 228'. To substantially prevent the semiconductor liner 204b' from being etched during this selective removal at block 130, a concentration of the hydrogen peroxide ($H_2O_2$) is increased comparing to that of the hydrogen peroxide ($H_2O_2$) used in the formation of the cap recess 252 described with reference to FIG. 13. In other words, the hydrogen peroxide ($H_2O_2$) at block 130 has a second concentration greater than a first concentration of the hydrogen peroxide ($H_2O_2$) at block 122. By increasing the concentration of the hydrogen peroxide, the etch selectively between the semiconductor plug 228' and the semiconductor liner 204' is increased, and the etchant solution with more hydrogen peroxide etches the semiconductor plug 228' at a third rate greater than the first rate associated with the formation of the cap recess 252. In some embodiments, the second concentration of the hydrogen peroxide ($H_2O_2$) is about 2 to about 5 times of the first concentration of the hydrogen peroxide ($H_2O_2$). In an embodiment, the second concentration of the hydrogen peroxide ($H_2O_2$) in the etchant solution may be between about 10% and about 30%. In some embodiments, the process temperature at block 130 may be between about 60° C. and about 70° C. and is higher than the process temperature at block 122.

Figure 19:
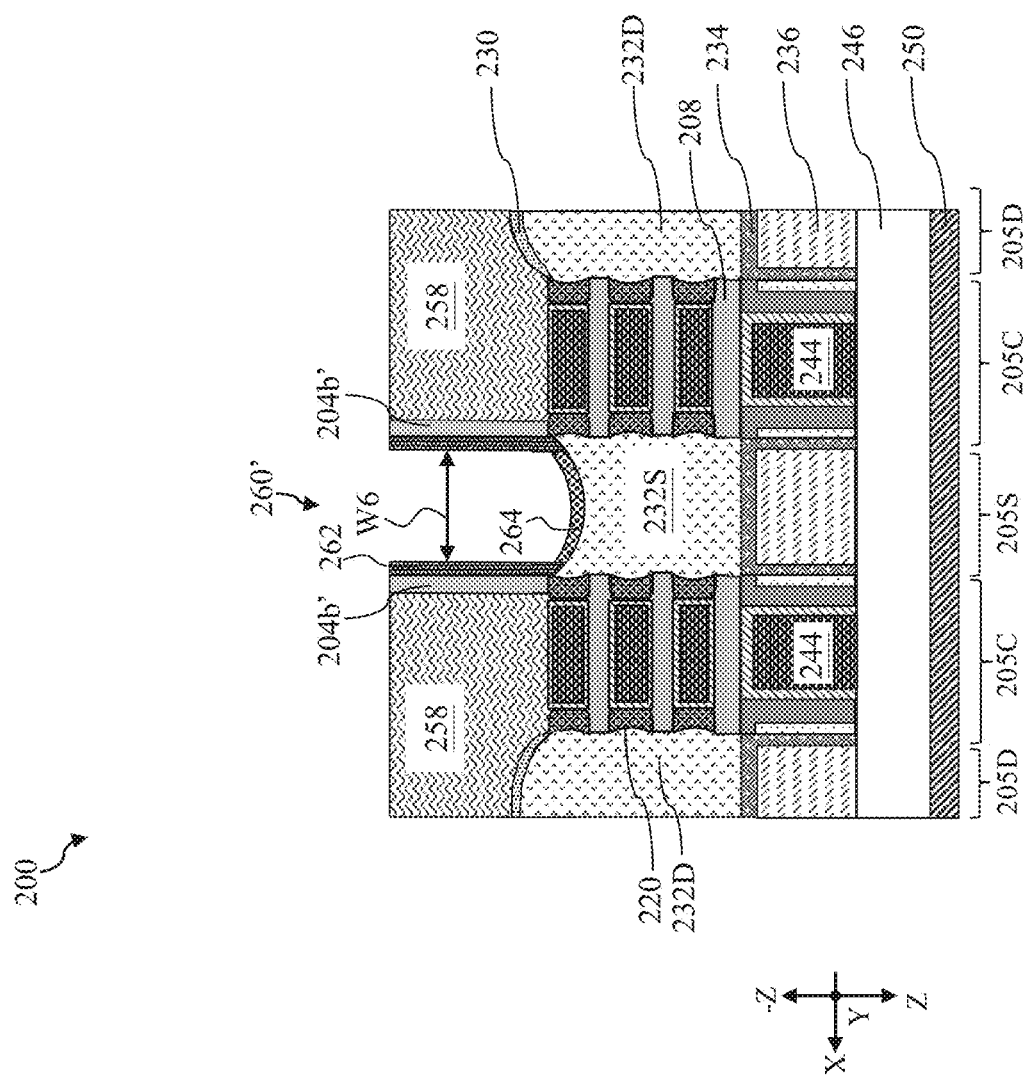

As shown in FIG. 19, after the formation of the backside source contact opening 260, in some embodiments, a dielectric barrier layer 262 is deposited over the workpiece 200 and is then etched back to only cover sidewalls of the backside source contact opening 260 and expose the source feature 232S. The backside source contact opening 260 partially covered by the dielectric barrier layer 262 may be referred to as backside source contact opening 260'. The backside source contact opening 260' has a width W6 along the X direction. In the present implementation, a ratio of W3 (shown in FIG. 14) to W6 is between about 0.3 and about 0.4 such that the dielectric cap 254 may protect enough semiconductor layer 204' from being etched in a subsequent etching process. A ratio of W4 (shown in FIG. 15) to W6 is between about 0.2 and about 0.3 to form a satisfactory gap in the final semiconductor device 200.

In some embodiments, the dielectric barrier layer 262 may include silicon nitride or other suitable materials. The dielectric barrier layer 262 extends along the semiconductor liner 204b' and disposed directly on the source feature 232S. Operations at block 130 also includes forming a silicide layer 264 on the exposed surface of the source feature 232S to reduce a contact resistance between the source feature 232S and the to-be-formed backside source contact 266. To form the silicide layer 264, a metal layer (not explicitly shown) is deposited over the exposed surfaces of the source feature 232S and an anneal process is performed to bring about silicidation reaction between the metal layer and the source feature 232S. Suitable metal layer may include titanium, tantalum, nickel, cobalt, or tungsten. In embodiments where the metal layer includes nickel and the source feature 232S includes silicon germanium, the silicide layer 264 includes nickel silicide, nickel germanide, and nickel germanosilicide. The silicide layer 264 generally tracks the shape of the exposed source feature 232S. Excessive metal layer that does not form the silicide layer 264 may be removed.

Figure 20:
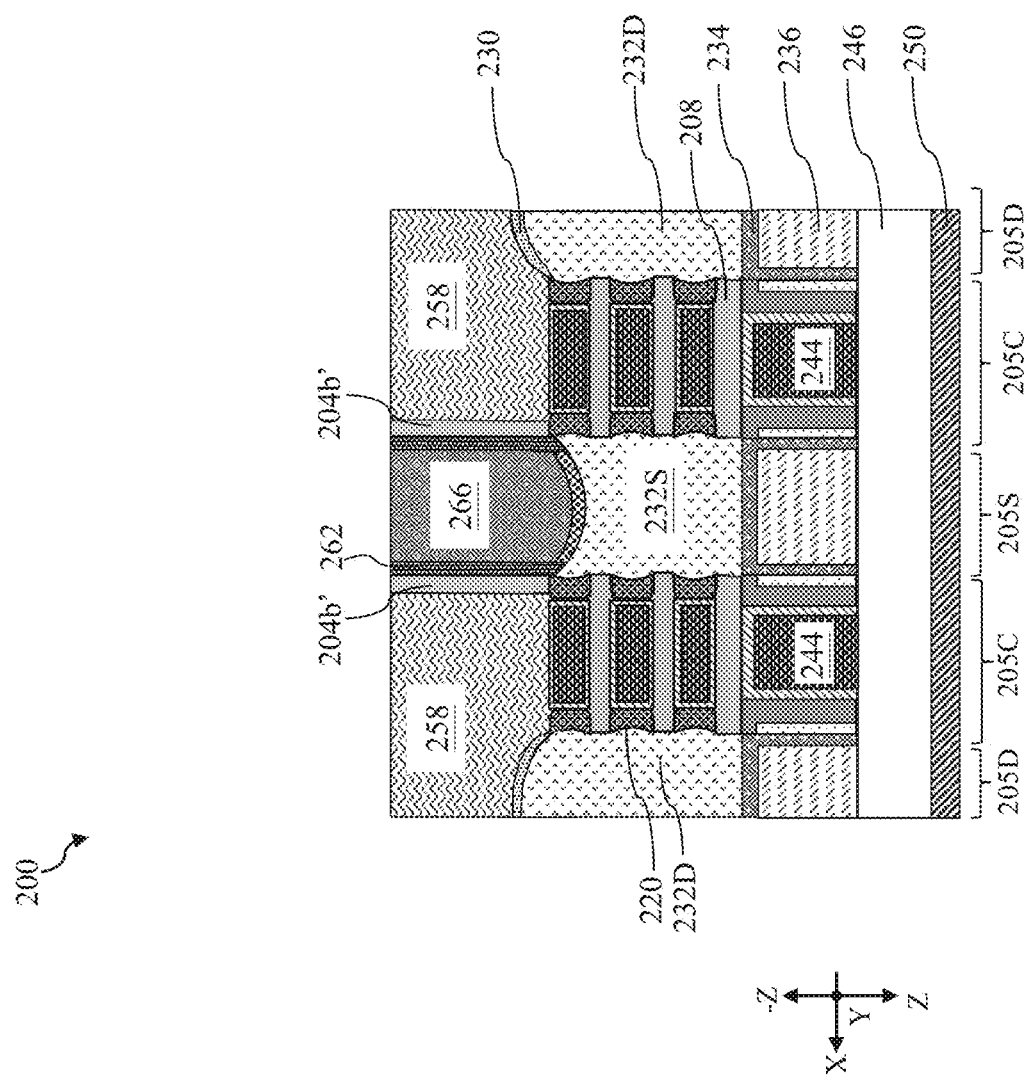

As shown in FIG. 20, after the formation of the silicide layer 264, the backside source contact 266 may be formed in the backside source contact opening 260' and has a width W6. The backside source contact 266 may include aluminum, rhodium, ruthenium, copper, iridium, or tungsten. A planarization process, such as a CMP process, may follow to remove excessive materials and provide a planar surface. The backside source contact 266 is electrically coupled to the source feature 232S by way of the silicide layer 264. In other words, the silicide layer 264 is sandwiched between the source feature 232S and the backside source contact 266.

Figure 21:
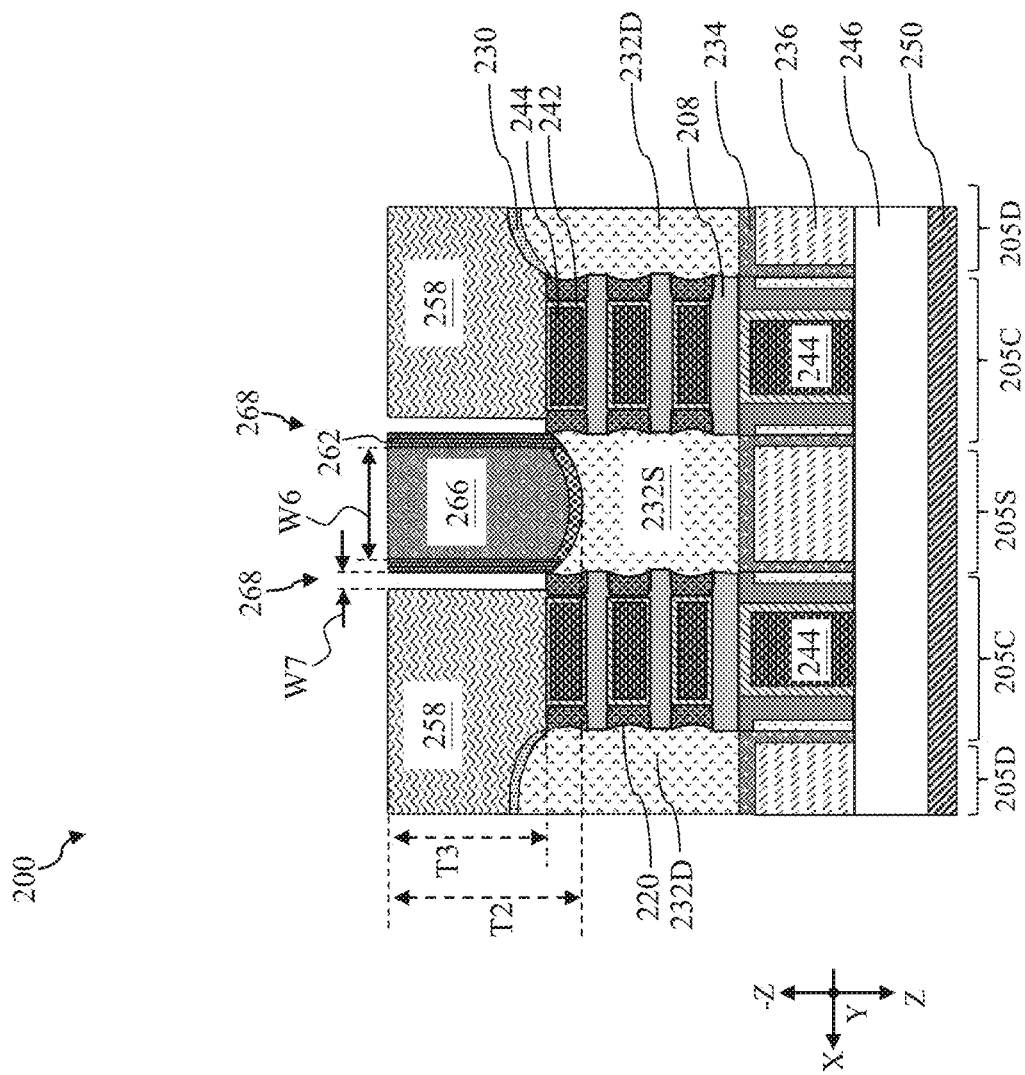
Figure 22:
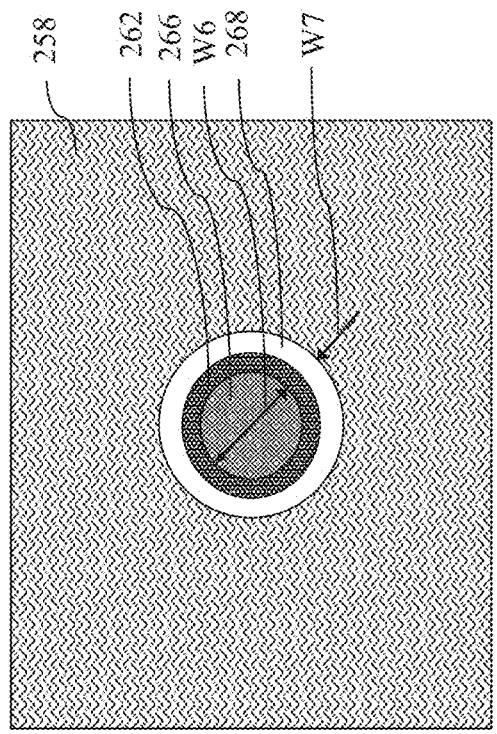

Referring to FIGS. 1 and 21-22, method 100 includes a block 132 where the semiconductor liner 204b' is selectively removed to form a trench 268. In some embodiments, after the formation of the backside source contact 266, the semiconductor liner 204b' may be selectively removed using a selective wet etch process or a selective dry etch process to form the trench 268. A suitable selective wet etch process or a suitable selective dry etch process may be performed during the selective removal. The selective removal of the semiconductor liner 204b' is self-aligned. When the semiconductor liner 204b' is formed of silicon (Si), a suitable selective dry etching process may include use of $CF_4$, $NF_3$, $Cl_2$, HBr, other suitable gases and/or plasmas, and/or combinations thereof. As shown in FIG. 21, the selective removal at block 132 does not substantially damage the dielectric layer 258, the dielectric barrier layer 262, or the backside source contact 266.

Still referring to FIG. 21, the removal of the semiconductor liner 204b' results in a trench 268. The trench 268 tracks the sidewall of the dielectric barrier layer 262 that is in direct contact with the source feature and is disposed between the dielectric layer 258 and the dielectric barrier layer 262 along the X direction. In embodiments where the workpiece 200 doesn't include the dielectric barrier layer 262, the trench 268 tracks the sidewall of the backside source contact 266 and is disposed between the dielectric layer 258 and the backside source contact 266 along the X direction, and a width W6 of the backside source contact 266 is substantially equal to the width W1 of the semiconductor plug 228'. As the semiconductor liner 204b' does not extend into the source feature 232S, the trench 268 also steers clear from the source feature 232S. After the etching process at block 132, a cross-sectional view of the trench 268 has a width W7 along the X direction, a depth T3 along the Z direction, and exposes a portion of the inner spacer feature 220. That is, the trench 268 doesn't expose the gate structure 240. A ratio of W7 to the width W6 of the backside source contact 266 is between about 0.1 and about 0.2 such that the trench 268 would not be substantially filled in a subsequent dielectric deposition process and a parasitic capacitance between the gate structure 240 and the backside source contact 266 may be advantageously reduced without damaging the gate structure 240 (e.g., induced by the dry etching at the block 132) or inducing a threshold voltage shifting. In an embodiment, based on the packing density and the performance demand, the width W7 of the trench 268 is between about 2 nm and about 4 nm. A ratio of the depth T3 of the trench 268 to the depth T2 of the backside source contact opening 260' is between about 0.8 and about 0.9 such that the parasitic capacitance between the gate structure 240 and the backside source contact 266 may be significantly reduced.

FIG. 22 depicts an exemplary fragmentary top view of the workpiece 200 after the formation of the trench 268. In this present embodiment, a shape of a top view of the backside source contact 266 includes a substantially round shape. A shape of a top view of the dielectric barrier layer 262 includes or resembles a disc shape or a donut shape. The trench 268 tracks the sidewall of the dielectric barrier layer 262 and also includes a disc shape or a donut shape. It is understood that the shape of the top view of the backside source contact 266 is not limited to the substantially round shape and the shape of a top view of the dielectric barrier layer 262 or the trench 268 is not limited to the disc shape.

Figure 23:
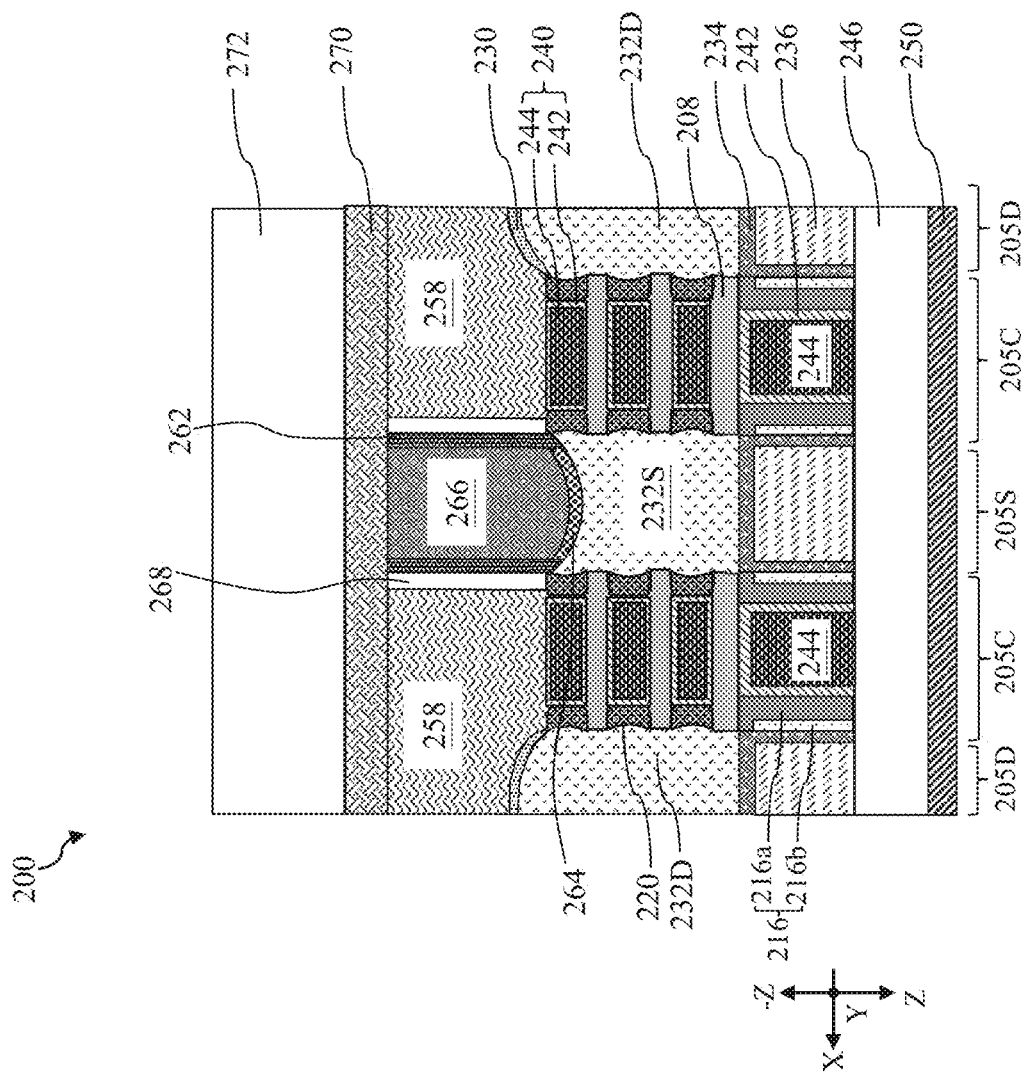

Referring to FIGS. 1 and 23, method 100 includes a block 134 where a backside power rail 270 is formed. While not explicitly shown in FIG. 23, the backside power rail 270 may be embedded in an insulation layer. In an exemplary process, an insulation layer having a composition similar to the ILD layer 236 may be deposited over the backside of the workpiece 200, including over the dielectric layer 258, the isolation feature, the backside source contact 266, and the trench 268. The trench 268 is thus sealed by the insulation layer. While not explicitly shown in FIG. 23, during the deposition of the insulation layer, depending on the dimension of the trench 268, a small portion of the insulation layer may penetrate into the upper portion of the trench 268. The trench 268 may also be referred to as a gap 268 or a void 268. The gap 268 may or may not include gaseous species. When the gap 268 includes gaseous species, it may also be referred to as an air gap 268. Such gaseous species may be remnants of inert or unreacted gaseous species present during the deposition of the insulation layer 269. A dielectric constant of the gap may be between about 1 and about 1.1. That is, the dielectric barrier layer 262 is spaced apart from the dielectric layer 258 by a low-k spacer (i.e., the gap 268). In embodiments where the semiconductor device 200 doesn't include the dielectric barrier layer 262 formed in the contact opening 260, the backside source contact 266 is spaced apart from the dielectric layer 258 by the low-k spacer (i.e., the gap 268).

Then, a power rail trench may be patterned in the insulation layer. A barrier layer and a metal fill material are then deposited into the power rail trench to form the backside power rail 270. In some embodiments, the barrier layer in the backside power rail 270 may include titanium nitride, tantalum nitride, cobalt nitride, nickel nitride, or tungsten nitride and the metal fill material in the backside power rail 270 may include titanium, ruthenium, copper, nickel, cobalt, tungsten, tantalum, or molybdenum. The barrier layer and the metal fill layer may be deposited using PVD, CVD, ALD, or electroless plating. A planarization process, such as a CMP process, may be performed to remove excessive materials over the insulation layer. A second interconnect structure 272 is formed and has a structure in a way similar to the first interconnect structure 246. Because the second interconnect structure 272 is formed over the back side of the workpiece 200, the second interconnect structure 272 may also be referred to as a backside interconnect structure 272.

Embodiments of the present disclosure provide advantages. Methods of the present disclosure form a gap disposed between a backside contact and a backside dielectric layer. Because a dielectric constant of the gap is low, the presence of the gap reduces the parasitic capacitance between the backside contact and an adjacent gate structure. Therefore, performances of the semiconductor structure may be improved. In addition, the methods of the present disclosure use self-align technologies to form the gap with a small dimension without using lithography processes, which significantly reduces the cost associated with the fabrication of the above device.

The present disclosure provides for many different embodiments. Semiconductor structures and methods of fabrication thereof are disclosed herein. In one exemplary aspect, the present disclosure is directed to a method. The method includes receiving a workpiece having a top surface and a bottom surface. The workpiece includes a number of channel members disposed over a substrate, a gate structure wrapping around each of the number of channel members, and a source feature adjacent to the number of channel members. The source feature is disposed over a semiconductor plug extending into the substrate. The method also includes flipping over the workpiece, selectively removing a first portion of the substrate without removing a second portion of the substrate adjacent to the semiconductor plug and without substantially damaging the semiconductor plug, forming a backside dielectric layer over the bottom surface of the workpiece, replacing the semiconductor plug with a backside contact, and selectively removing the second portion of the substrate to form a gap between the backside dielectric layer and the backside contact.

In some embodiments, the method may also include, before the selectively removing of the first portion of the substrate, performing a first etching process to etch the semiconductor plug and the substrate to form a recess, and forming a dielectric capping layer in the recess. The first etching process may etch the semiconductor plug at a rate greater than etching the substrate. The dielectric capping layer may be disposed directly over the semiconductor plug and the second portion of the substrate.

In some embodiments, the first etching process may include using a wet etching process to selectively etch the semiconductor plug. In some embodiments, the wet etching process may include use of $NH_4OH$ and $H_2O_2$. In some embodiments, the dielectric capping layer may include silicon nitride, silicon oxide, or silicon oxynitride.

In some embodiments, the replacing of the semiconductor plug with the backside contact may include performing a second etching process to selectively remove the semiconductor plug without substantially damaging the second portion of the substrate to form a contact opening, and forming the backside contact in the contact opening. In some embodiments, the first etching process and the second etching process may implement an etchant, and a concentration of the etchant in the first etching process may be less than a concentration of the etchant in the second etching process.

In some embodiments, the selectively removing of the first portion of the substrate may include performing a third etching process, the selectively removing of the second portion of the substrate may include performing a fourth etching process, and the third etching process and the fourth etching process may include a dry etching process. In some embodiments, the dry etching process may include implementing $CF_4$, $Cl_2$, $NF_3$, or HBr. In some embodiments, the method may include depositing an interlayer dielectric layer over the gap and forming a backside power rail in the interlayer dielectric layer.

In another exemplary aspect, the present disclosure is directed to a method. The method includes receiving a workpiece including a first active region and a second active region over a substrate, a source feature disposed between the first active region and the second active region along a direction, and a sacrificial plug disposed in the substrate and under the source feature. The method also includes flipping over the workpiece, forming a hard mask directly over the sacrificial plug and a first portion of the substrate laterally adjacent to the sacrificial plug, replacing a second portion of the substrate not covered by the hard mask with a backside dielectric layer, removing the hard mask to expose the sacrificial plug and the first portion of the substrate, replacing the sacrificial plug with a backside contact, and selectively removing the first portion of the substrate to form a gap between the backside dielectric layer and the backside contact.

In some embodiments, the replacing of the second portion of the substrate with the backside dielectric layer may include performing a dry etching process to selectively remove the second portion of the substrate without substantially damaging the hard mask to form an opening and depositing a backside dielectric layer in the opening.

In some embodiments, the method may also include, before the forming of the hard mask, performing a wet etching process to remove a portion of the sacrificial plug and a third portion of the substrate to form a recess that exposes the first portion of the substrate. The third portion of the substrate may be around the portion of the sacrificial plug. The wet etching process may etch the sacrificial plug at a rate greater than etching the substrate.

In some embodiments, the forming of the hard mask may include depositing a hard mask layer in the recess and performing a planarization process to remove excessive hard mask layer over the second portion of the substrate to form the hard mask. In some embodiments, the hard mask may include a top surface away from the sacrificial plug and a bottom surface adjacent to the sacrificial plug, the top surface may be wider than the bottom surface along the direction. In some embodiments, the wet etching process may include implementing ammonium hydroxide and hydrogen peroxide.

In yet another exemplary aspect, the present disclosure is directed to a semiconductor device. The semiconductor device includes a number of nanostructures, a source feature coupled to each of the number of nanostructures, a backside source contact disposed over the source feature, a liner disposed along sidewall of the backside source contact, a gate structure wrapping around each of the number of nanostructures, and a backside dielectric layer disposed over the gate structure. The backside source contact is spaced apart from the backside dielectric layer by the liner and a gap.

In some embodiments, the semiconductor device may also include a number of inner spacer features interleaving the number of nanostructures. A width of each of the number of inner spacer features may be greater than a width of the gap. In some embodiments, the semiconductor device may also include an interlayer dielectric layer disposed over a bottom surface of the backside source contact and a backside power rail disposed in the interlayer dielectric layer and electrically connected to the backside source contact. In some embodiments, the gap may wrap around a sidewall of the liner.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece comprising:
        a plurality of channel members disposed over a substrate,
        a gate structure wrapping around each of the plurality of channel members, and
        a source feature adjacent to the plurality of channel members, wherein the source feature is disposed over a semiconductor plug extending into the substrate, the workpiece comprising a top surface and a bottom surface;
    flipping over the workpiece;
    selectively removing a first portion of the substrate without removing a second portion of the substrate adjacent to the semiconductor plug and without substantially damaging the semiconductor plug;
    forming a backside dielectric layer over the bottom surface of the workpiece;
    replacing the semiconductor plug with a backside contact; and
    selectively removing the second portion of the substrate to form a gap between the backside dielectric layer and the backside contact.

2. The method of claim 1, further comprising:
    before the selectively removing of the first portion of the substrate, performing a first etching process to etch the semiconductor plug and the substrate to form a recess; and
    forming a dielectric capping layer in the recess,
    wherein the first etching process etches the semiconductor plug at a rate greater than etching the substrate,
    wherein the dielectric capping layer is disposed directly over the semiconductor plug and the second portion of the substrate.

3. The method of claim 2, wherein the first etching process comprises using a wet etching process to selectively etch the semiconductor plug.

4. The method of claim 3, wherein the wet etching process comprises use of $NH_4OH$ and $H_2O_2$.

5. The method of claim 2, wherein the dielectric capping layer comprises silicon nitride, silicon oxide, or silicon oxynitride.

6. The method of claim 2, wherein the replacing of the semiconductor plug with the backside contact comprising:
    performing a second etching process to selectively remove the semiconductor plug without substantially damaging the second portion of the substrate to form a contact opening; and
    forming the backside contact in the contact opening.

7. The method of claim 6,
    wherein the first etching process and the second etching process implement an etchant,
    wherein a concentration of the etchant in the first etching process is less than a concentration of the etchant in the second etching process.

8. The method of claim 1,
    wherein the selectively removing of the first portion of the substrate comprises performing a third etching process,
    wherein the selectively removing of the second portion of the substrate comprises performing a fourth etching process, and
    the third etching process and the fourth etching process comprise a dry etching process.

9. The method of claim 8, wherein the dry etching process comprises implementing $CF_4$, $Cl_2$, $NF_3$, or HBr.

10. The method of claim 1, further comprising:
    depositing an interlayer dielectric layer over the gap; and
    forming a backside power rail in the interlayer dielectric layer.

11. A method, comprising:
    receiving a workpiece including:
        a first active region and a second active region over a substrate, a source feature disposed between the first active region and the second active region along a direction, and a sacrificial plug disposed in the substrate and under the source feature;

flipping over the workpiece;

forming a hard mask directly over the sacrificial plug and a first portion of the substrate laterally adjacent to the sacrificial plug;

replacing a second portion of the substrate not covered by the hard mask with a backside dielectric layer;

removing the hard mask to expose the sacrificial plug and the first portion of the substrate;

replacing the sacrificial plug with a backside contact; and selectively removing the first portion of the substrate to form a gap between the backside dielectric layer and the backside contact.

12. The method of claim 11, wherein the replacing of the second portion of the substrate with the backside dielectric layer comprising:

performing a dry etching process to selectively remove the second portion of the substrate without substantially damaging the hard mask to form an opening; and depositing a backside dielectric layer in the opening.

13. The method of claim 11, further comprising:

before the forming of the hard mask, performing a wet etching process to remove a portion of the sacrificial plug and a third portion of the substrate to form a recess that exposes the first portion of the substrate, wherein the third portion of the substrate is around the portion of the sacrificial plug, wherein the wet etching process etches the sacrificial plug at a rate greater than etching the substrate.

14. The method of claim 13, wherein the forming of the hard mask comprises:

depositing a hard mask layer in the recess; and performing a planarization process to remove excessive hard mask layer over the second portion of the substrate to form the hard mask.

15. The method of claim 13, wherein the hard mask comprises a top surface away from the sacrificial plug and a bottom surface adjacent to the sacrificial plug, wherein the top surface is wider than the bottom surface along the direction.

16. The method of claim 13, wherein the wet etching process comprises implementing ammonium hydroxide and hydrogen peroxide.

17. A semiconductor device, comprising:

a plurality of nanostructures;

a source feature coupled to each of the plurality of nanostructures;

a backside source contact disposed over the source feature;

a liner disposed along sidewall of the backside source contact;

a gate structure wrapping around each of the plurality of nanostructures; and, a backside dielectric layer disposed over the gate structure, wherein the backside source contact is spaced apart from the backside dielectric layer by the liner and an air gap.

18. The semiconductor device of claim 17, further comprising:

a plurality of inner spacer features interleaving the plurality of nanostructures, wherein a width of each of the plurality of inner spacer features is greater than a width of the gap.

19. The semiconductor device of claim 17, further comprising:

an interlayer dielectric layer disposed over a bottom surface of the backside source contact; and a backside power rail disposed in the interlayer dielectric layer and electrically connected to the backside source contact.

20. The semiconductor device of claim 17, wherein the air gap wraps around a sidewall of the liner.

* * * * *